US012813093B2

(12) United States Patent
Lee et al.

(10) Patent No.: US 12,813,093 B2
(45) Date of Patent: Nov. 24, 2026

(54) LIGHT EMITTING DISPLAY DEVICE

(71) Applicant: Samsung Display Co., LTD., Yongin-si (KR)

(72) Inventors: Dong-Hoon Lee, Yongin-si (KR); Bon-Yong Koo, Yongin-si (KR); Taegyun Kim, Yongin-si (KR); Min Jae Jeong, Yongin-si (KR); Jae Hyung Cho, Yongin-si (KR); Mindo Heo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 114 days.

(21) Appl. No.: 18/918,491

(22) Filed: Oct. 17, 2024

(65) Prior Publication Data

US 2025/0169290 A1 May 22, 2025

(30) Foreign Application Priority Data

Nov. 20, 2023 (KR) ........................ 10-2023-0161052

(51) Int. Cl.
*H10K 59/122* (2023.01)
*H10K 59/131* (2023.01)

(52) U.S. Cl.
CPC ......... *H10K 59/122* (2023.02); *H10K 59/131* (2023.02)

(58) Field of Classification Search
CPC ........................... H10K 59/122; H10K 59/131
See application file for complete search history.

(56) References Cited

U.S. PATENT DOCUMENTS

| | | | | |
|---|---|---|---|---|
| 11,075,253 | B2 * | 7/2021 | Kong | G09G 3/3225 |
| 11,348,983 | B1 | 5/2022 | Choung et al. | |
| 2008/0218061 | A1 | 9/2008 | Chao et al. | |
| 2015/0097171 | A1 * | 4/2015 | Kim | H10K 59/121 438/23 |
| 2022/0165818 | A1 | 5/2022 | Kinjo | |
| 2022/0223670 | A1 | 7/2022 | Choi et al. | |

FOREIGN PATENT DOCUMENTS

| | | | |
|---|---|---|---|
| CN | 114551519 | A | 5/2022 |
| CN | 115220599 | | 10/2022 |
| CN | 115589751 | | 1/2023 |
| EP | 3136440 | A1 | 3/2017 |
| KR | 10-2005-0049688 | A | 5/2005 |
| KR | 10-0705819 | B1 | 4/2007 |
| KR | 10-2024-0127509 | | 8/2024 |

* cited by examiner

*Primary Examiner* — Mariceli Santiago

(57) ABSTRACT

A light emitting display device includes a pixel driving part including a transistor, a planarization layer covering the pixel driving part, an anode of a light emitting diode disposed on the planarization layer, a pixel defining layer including an opening that overlaps the anode of the light emitting diode in a plan view, and including an inorganic insulating material, a wall including an opening overlapping the opening of the pixel defining layer and having conductivity, a light emitting layer disposed in the opening of the pixel defining layer, a cathode of the light emitting diode disposed on the light emitting layer, and a separator dividing the wall into a first wall and a second wall, wherein the first wall is electrically connected to the transistor of the pixel driving part through a first contact hole passing through the pixel defining film and the planarization layer.

20 Claims, 17 Drawing Sheets

LIGHT EMITTING DISPLAY DEVICE

CROSS-REFERENCE TO RELATED APPLICATION(S)

This application claims priority to and benefits of Korean Patent Application No. 10-2023-0161052 under 35 U.S.C. § 119, filed on Nov. 20, 2023, at the Korean Intellectual Property Office, the entire contents of which are incorporated herein by reference.

BACKGROUND

1. Technical Field

Embodiments relate to a light emitting display device.

2. Description of the Related Art

A display device is a device that displays a screen and includes a liquid crystal display (LCD) and an organic light emitting diode (OLED). These display devices are used in various electronic devices such as mobile phones, navigation devices, digital cameras, electronic books, portable game consoles, and various terminals.

Organic light emitting display devices have self-luminance characteristics and, unlike liquid crystal displays, do not require a separate light source, so thickness and weight may be reduced. Further, organic light emitting display devices have high-quality characteristics such as low power consumption, high luminance, and fast response speed.

SUMMARY

Embodiments provide a light emitting display device capable of applying a power voltage to an anode of a light emitting diode using a separator.

Further, embodiments provide a light emitting display device that has high resolution by applying a selected voltage to a portion of the separator or that shields or blocks noise from being transmitted to a touch-sensing electrode.

A light emitting display device according to an embodiment may include a pixel driving part including a transistor; a planarization layer covering the pixel driving part; an anode of a light emitting diode disposed on the planarization layer; a pixel defining layer including an opening that overlaps the anode of the light emitting diode in a plan view, and including an inorganic insulating material; a wall including an opening overlapping the opening of the pixel defining layer and having conductivity; a light emitting layer disposed in the opening of the pixel defining layer; a cathode of the light emitting diode disposed on the light emitting layer; and a separator dividing the wall into a first wall and a second wall, the first wall may be electrically connected to the transistor of the pixel driving part through a first contact hole passing through the pixel defining layer and the planarization layer, and the cathode of the light emitting diode is in contact with a side of the first wall and may be electrically connected to the transistor.

The first wall may include a first conductive wall and a second conductive wall disposed on the first conductive wall, and the second conductive wall may have a tip portion that protrudes from the first conductive wall.

The tip portion may protrude toward the opening of the first wall overlapping the opening of the pixel defining layer.

The first conductive wall may include aluminum, and the second conductive wall may include titanium.

The first wall may be an inner conductive wall, the second wall may be an outer conductive wall, the inner conductive wall may surround the opening of the pixel defining layer in a plan view, and the outer conductive wall may be electrically separated from the inner conductive wall, the inner conductive wall may include a first inner conductive wall and a second inner conductive wall disposed on the first inner conductive wall, and the outer conductive wall may include a first outer conductive wall and a second outer conductive wall disposed on the first outer conductive wall.

The inner conductive wall may be electrically connected to the transistor of the pixel driving part through the first contact hole, and the outer conductive wall may receive a constant voltage through a second contact hole passing through the pixel defining layer and the planarization layer.

Aa separated light emitting layer and a separated cathode may be formed on the outer conductive wall, respectively, and may be separated from the light emitting layer and the cathode by the separator.

The light emitting display device may further include an encapsulation layer covering the wall and the cathode, and the separator may include an empty space passing through the encapsulation layer and the wall.

The empty space of the separator may be filled with an insulating material.

The light emitting display device may further include a transparent electrode formed of a transparent conductive material and disposed on the encapsulation layer and the separator, and a constant voltage may be applied to the transparent electrode.

The light emitting display device may further include an encapsulation layer covering the wall and the cathode, the separator may pass through the wall and is disposed between the first wall and the second wall, and the encapsulation layer may be disposed on the separator.

A light emitting display device according to an embodiment may include a pixel driving part including a transistor; a planarization layer covering the pixel driving part; an anode of a light emitting diode disposed on the planarization layer; a pixel defining layer including an opening that overlaps the anode of the light emitting diode in a plan view, and including a black pixel defining layer and a transparent pixel defining layer; a wall including an opening overlapping the opening of the pixel defining layer and having conductivity; a light emitting layer disposed in the opening of the pixel defining layer; a cathode of the light emitting diode disposed on the light emitting layer; and a separator dividing the wall into a first wall and a second wall, the first wall may be electrically connected to the transistor of the pixel driving part through a first contact hole passing through the pixel defining layer and the planarization layer, the cathode of the light emitting diode may be in contact with a side of the first wall and may be electrically connected to the transistor, the black pixel defining layer may be formed of a black organic material or an organic material including a light blocking material, and the transparent pixel defining layer may be formed of a photosensitive organic insulating material that transmits light.

The pixel defining layer may further include an intermediate pixel defining layer, and intermediate pixel defining layer may be an inorganic insulating layer, and may be disposed between the black pixel defining layer and the transparent pixel defining layer.

The first wall may include a first conductive wall and a second conductive wall disposed on the first conductive wall, the second conductive wall may have a tip portion protruding from the first conductive wall, and the tip portion may protrude toward the opening of the first wall overlapping the opening of the pixel defining layer.

The first conductive wall may include aluminum, and the second conductive wall may include titanium.

The first wall may be an inner conductive wall, the second wall may be an outer conductive wall, the inner conductive wall may surround the opening of the pixel defining layer in a plan view, and the outer conductive wall may be electrically separated from the inner conductive wall, the inner conductive wall may include a first inner conductive wall and a second inner conductive wall disposed on the first inner conductive wall, the outer conductive wall may include a first outer conductive wall and a second outer conductive wall disposed on the first outer conductive wall, the inner conductive wall may be electrically connected to the transistor of the pixel driving part through the first contact hole, the outer conductive wall may receive a constant voltage through a second contact hole passing through the pixel defining layer and the planarization layer.

A separated light emitting layer and a separated cathode may be formed on the outer conductive wall, respectively, and may be separated from the light emitting layer and the cathode by the separator.

The light emitting display device may further include an encapsulation layer covering the wall and the cathode, and the separator may include an empty space passing through the encapsulation layer and the wall.

The empty space of the separator may be filled with an insulating material.

The light emitting display device may further include an encapsulation layer covering the wall and the cathode, the separator may pass through the wall and may be disposed between the first wall and the second wall, and the encapsulation layer may be disposed on the separator.

According to embodiments, the separator may be formed by etching a wall including at least two layers made of a conductive material to form an empty space or by filling the empty space with an insulating material, so that the layers may be separated by the separator, and a voltage may be applied to an electrode of the light emitting diode by electrically connecting an electrode of the light emitting diode to the wall.

According to embodiments, the voltage line may be removed by allowing a selected voltage to be applied to another part of the separator, thereby providing a high-resolution light emitting display device.

According to embodiments, the object is to provide a light emitting display device that shields noise from being transmitted to a touch-sensing electrode disposed on the front side by allowing a selected voltage to be applied to another part of the separator.

DETAILED DESCRIPTION OF THE EMBODIMENTS

Figure 1:
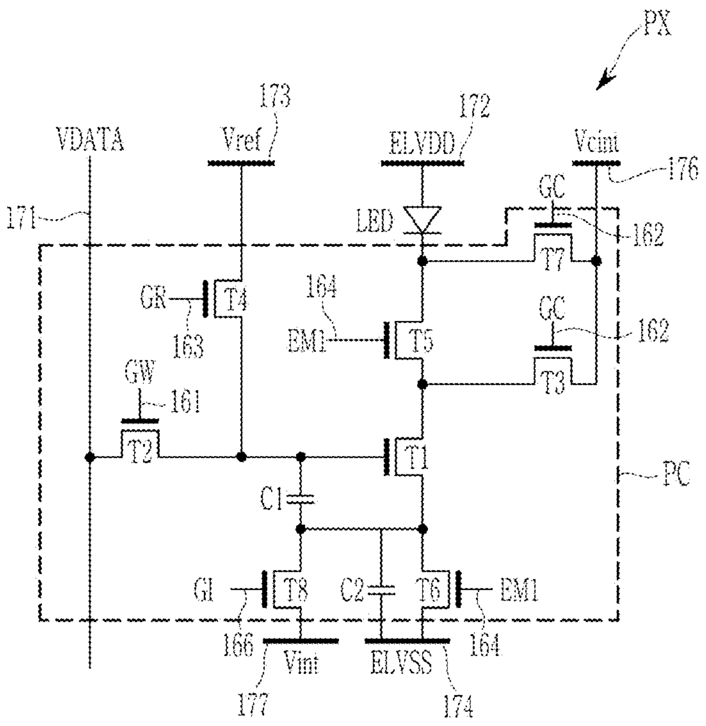
FIG. 1 is a schematic diagram of an equivalent circuit of a pixel included in a light emitting display device according to an embodiment.

Hereinafter, with reference to the attached drawings, various embodiments will be described in detail so that those skilled in the art can easily implement the invention.

The invention may be implemented in many different forms and is not limited to the embodiments described herein.

In order to clearly explain the invention, parts that are not relevant to the description are omitted, and identical or similar components are assigned the same reference numerals throughout the specification.

Further, the magnitude and thickness of each component shown in the drawings are arbitrarily shown for convenience of explanation, so the invention is not necessarily limited to that which is shown.

In the drawings, the thickness is enlarged to clearly express various layers and areas.

And in the drawings, for convenience of explanation, the thicknesses of some layers and regions are exaggerated.

Further, when a part, such as a layer, membrane, region, plate or component is said to be "above" or "on" another part, this means not only when it is "directly above" another part, but also when there is another part in between.

Conversely, when a part is said to be "right on top" of another part, it means that there is no other part in between.

Further, being "above" or "on" a reference portion means being disposed above or below the reference portion, and does not necessarily mean being disposed "above" or "on" it in the direction opposite to gravity.

Further, throughout the specification, when a part is said to "include" a certain component, this means that it may further include other components rather than excluding other components, unless specifically stated to the contrary.

Further, throughout the specification, when reference is made to "in a plan view," this means when the target portion is viewed from above, and when reference is made to "in cross-section," this means when a cross-section of the target portion is cut vertically and viewed from the side.

Further, throughout the specification, when "connected" is used, this does not mean only when two or more components are directly connected, but when two or more components are indirectly connected through other components, they are physically connected. This may include not only the case of being connected or electrically connected, but also the case where each part, which is referred to by different names according to location or function, is substantially connected to the other parts.

Further, throughout the specification, when a portion such as a wiring, layer, film, region, plate, or component is said to "extend in the first or second direction," this means not only a straight shape extending in that direction, but a structure that extends overall along the first or second direction, and also includes a structure that is bent at some part, has a zigzag structure, or extends while including a curved structure.

Further, electronic devices (e.g., mobile phones, TVs, monitors, laptop computers, etc.) including display devices, display panels, etc. described in the specification, or display devices, display panels, etc. manufactured by the manufacturing method described in the specification are also not excluded from the scope of rights herein.

A light emitting display device may include a display area, and pixels may be disposed within the display area.

Hereinafter, the circuit structures of the light emitting diode LED and the pixel driving part PC included in a pixel PX will be described through FIGS. 1 to 3.

For example, the pixel PX, the signals applied to the pixel PX, and the operations of the pixel PX will be described in detail according to an embodiment referring to FIG. 1 and FIG. 2.

FIG. 1 is a schematic diagram of an equivalent circuit of a pixel PX included in a light emitting display device according to an embodiment.

Referring to FIG. 1, a pixel PX may include a light emitting diode LED and a pixel driving part PC that drives the light emitting diode LED. The pixel driving part PC may include all elements except the light emitting diode LED in FIG. 1, and the pixel driving part PC of the pixel PX according to the embodiment of FIG. 1 may include the first transistor T1, the second transistor T2, the third transistor T3, the fourth transistor T4, the fifth transistor T5, the sixth transistor T6, the seventh transistor T7, the eighth transistor T8, the first capacitor C1, and the second capacitor C2.

For example, the pixel driving part PC may include a first scan line 161 to which a first scan signal GW is applied, a second scan line 162 to which a second scan signal GC is applied, a third scan line 163 to which a third scan signal GR is applied, a fourth scan line 166 to which a fourth scan signal GI is applied, a light emission signal line 164 to which a light emission signal EM1 is applied, and a data line 171 to which a data voltage VDATA is applied.

For example, the pixel PX may be connected to a driving voltage line 172 where a driving voltage (ELVDD; also referred to as the first driving voltage) is applied, a driving low-voltage line 174 where a driving low voltage (ELVSS; also referred to as the second driving voltage) is applied, a reference voltage line 173 where a reference voltage Vref is applied, a first initialization voltage line 177 where a first initialization voltage Vint is applied, and a second initialization voltage line 176 where a second initialization voltage Vcint is applied. The circuit structure of the pixel, focusing on each element (e.g., transistor, capacitor, and light emitting element) included in the pixel, is as follows.

The first transistor T1 (hereinafter also referred to as the driving transistor) may include a gate electrode, a first electrode, and a second electrode. The gate electrode of the first transistor T1 may be connected to a first electrode of the first capacitor C1, a second electrode of the second transistor T2, and a second electrode of the fourth transistor T4. The first electrode (e.g., input side electrode) of the first transistor T1 may be connected to a second electrode of the third transistor T3 and a second electrode of the fifth transistor T5. The second electrode (e.g., output side electrode) of the first transistor T1 may be connected to a first electrode of the sixth transistor T6, a second electrode of the eighth transistor T8, a second electrode of the first capacitor C1, and a second electrode of a second capacitor C2.

The degree, to which the first transistor T1 is turned, may be determined by the voltage of the gate electrode of the first transistor T1. The degree, to which the first transistor T1 is turned, may adjust the magnitude of the current flowing from the first electrode to the second electrode of the first transistor T1. The current flowing from the first electrode to the second electrode of the first transistor T1 may be the same as the current flowing through the light emitting diode LED in the light emitting period and may also be referred to as the light emission current. For example, the first transistor T1 may be formed as an n-type transistor. As the voltage of the gate electrode increases, the light emission current may increase. In case that the light emission current is large, the light emitting diode LED may display high brightness.

The second transistor T2 (referred to as the data input transistor) may include a gate electrode, a first electrode, and a second electrode. The gate electrode of the second transistor T2 may be connected to the first scan line 161 where the first scan signal GW is applied. The first electrode (e.g., input side electrode) of the second transistor T2 may be connected to the data line 171 where the data voltage VDATA is applied, a first electrode of the first capacitor C1, and a gate electrode of the first transistor T1. The second electrode (e.g., output side electrode) of the second transistor T2 may be connected to the second electrode of the fourth transistor T4. The second transistor T2 may transfer the data voltage VDATA into the pixel PX according to the first scan signal GW and may apply the data voltage VDATA to the gate electrode of the first transistor T1, and the data voltage VDATA may be stored in the first electrode of the first capacitor C1.

The third transistor T3 (hereinafter also referred to as the first voltage transfer transistor or the second initialization voltage transfer transistor) may include a gate electrode, a first electrode, and a second electrode. The gate electrode of the third transistor T3 may be connected to the second scan line 162 to which the second scan signal GC is applied. The first electrode (e.g., input side electrode) of the third transistor T3 may be connected to the second initialization voltage line 176 to which the second initialization voltage Vcint is applied. The second electrode (e.g., output side electrode) of the third transistor T3 may be connected to the first electrode of the first transistor T1 and the second electrode of the fifth transistor T5. The third transistor T3 may transfer the second initialization voltage Vcint to the first transistor T1 without passing through the light emitting diode LED.

For example, the second initialization voltage Vcint may have a positive voltage value similar to the driving voltage ELVDD. According to the embodiment, a driving voltage ELVDD or a bias voltage (Vbias) may be applied instead of the second initialization voltage Vcint. In case that current flows through the light emitting diode LED, the third transistor T3 may cause a problem in that the light emitting diode LED emits light unnecessarily, so the second initialization voltage Vcint may be connected to the third transistor T3 through a separate path to transmit the second initialization voltage Vcint to the first transistor T1. Therefore, the third transistor T3 may not be turned on during the light emission period, but may be turned on during other periods.

The fourth transistor T4 (hereinafter also referred to as a reference voltage transfer transistor) may include a gate electrode connected to the third scan line 163 to which the third scan signal GR is applied, a first electrode connected to the reference voltage line 173, and a second electrode connected to a first electrode of the first capacitor C1, the gate electrode of the first transistor T1, and the second electrode of the second transistor T2. The fourth transistor T4 may function to initialize the gate electrode of the first transistor T1 by transferring the reference voltage Vref to the first electrode of the first capacitor C1 and the gate electrode of the first transistor T1.

The fifth transistor T5 (referred to as a cathode-connected transistor) may include a gate electrode connected to the light emission signal line 164 where the light emission signal EM1 is applied, a first electrode connected to a cathode of the light emitting diode LED and a second electrode of the seventh transistor T7, and a second electrode connected to the first electrode of the first transistor T1 and the second electrode of the third transistor T3. The fifth transistor T5 may provide a current path by connecting the first electrode of the first transistor T1 and the light emitting diode LED based on the light emission signal EM1, which enables the light emitting diode LED to emit light.

The sixth transistor T6 (hereinafter also referred to as the driving low voltage application transistor) may include a gate electrode connected to the light emission signal line 164, to which the light emission signal EM1 is applied, a first electrode connected the second electrode of the first transistor T1, the second electrode of the eighth transistor T8, the second electrode of the first capacitor C1, and the second electrode of the second capacitor C2, and a second electrode receiving the driving low voltage ELVSS. The sixth transistor T6 may function to transmit or block the driving low voltage ELVSS to the second electrode of the first transistor T1 based on the light emission signal EM1.

The seventh transistor T7 (hereinafter also referred to as the second voltage transfer transistor) may include a gate electrode connected to the second scan line 162 to which the second scan signal GC is applied and a second electrode (e.g., output side electrode) connected to the second initialization voltage line 176, to which the second initialization voltage Vcint is applied. The seventh transistor T7 may further include a first electrode (e.g., input side electrode) and connected to the cathode of the light emitting diode LED and the first electrode of the fifth transistor T5. The seventh transistor T7 may function to transfer the second initialization voltage Vcint to the cathode of the light emitting diode LED, and may change the voltage level of the cathode of the light emitting diode LED to the second initialization voltage Vcint, thereby solving the problem of not being able to display black clearly due to the charge remaining on the cathode of the light emitting diode LED.

For example, the second initialization voltage Vcint may have a positive voltage value similar to the driving voltage ELVDD. In another example, a driving voltage ELVDD or a bias voltage (Vbias) may be used instead of the second initialization voltage Vcint.

The eighth transistor T8 (referred to as the first initialization voltage transfer transistor) may include a gate electrode connected to the fourth scan line 166, to which the fourth scan signal GI is applied, a first electrode (e.g., input side electrode) connected to the first initialization voltage line 177, to which the first initialization voltage Vint is applied, and a second electrode (e.g., output side electrode) connected to the second electrode of the first transistor T1, the first electrode of the sixth transistor T6, the second electrode of the first capacitor C1, and the second electrode of the second capacitor C2. The eighth transistor T8 may function to initialize the second electrode of the first transistor T1 by applying the first initialization voltage Vint to the second electrode of the first transistor T1, the first electrode of the sixth transistor T6, the second electrode of the first capacitor C1, and the second electrode of the second capacitor C2.

In the embodiment of FIG. 1, all transistors may be formed as n-type transistors, and each transistor may be turned on in case that the voltage of the gate electrode is at a high level and turned off in case that the voltage at the gate electrode is at a low level.

For example, the semiconductor layer included in each transistor may be formed of a polycrystalline silicon semiconductor or an oxide semiconductor. In another example, the semiconductor layer included in each transistor may be formed of an amorphous semiconductor or a single crystal semiconductor.

According to the embodiment, the semiconductor layer included in each transistor may further include an overlapping layer (or additional gate electrode) that overlaps the gate electrode. For example, the characteristics of the transistor may be changed to improve the display quality of the pixel PX by applying a voltage to the overlapping layer (or additional gate electrode).

The first capacitor C1 may include a first electrode connected to the gate electrode of the first transistor T1, a second electrode of the second transistor T2, and a second electrode of the fourth transistor T4. The first capacitor C1 may include a second electrode connected to the second electrode of the first transistor T1, the first electrode of the sixth transistor T6, the second electrode of the eighth transistor T8, and a second electrode of the second capacitor C2. The first electrode of the first capacitor C1 may function to receive and store the data voltage VDATA from the second transistor T2.

The second capacitor C2 may include a first electrode connected to the driving low-voltage line 174, to which the driving low voltage ELVSS is applied, and a second electrode connected to the second electrode of the first capacitor C1, the second electrode of the first transistor T1, the first electrode of the sixth transistor T6, and the second electrode of the eighth transistor T8. The second capacitor C2 may function to keep the voltage of the second electrode of the first transistor T1 and the second electrode of the first capacitor C1 constant. For example, according to the embodiment, the first electrode of the second capacitor C2 may be connected to the driving voltage line 172. In another example, the second capacitor C2 may be omitted.

Figure 5:
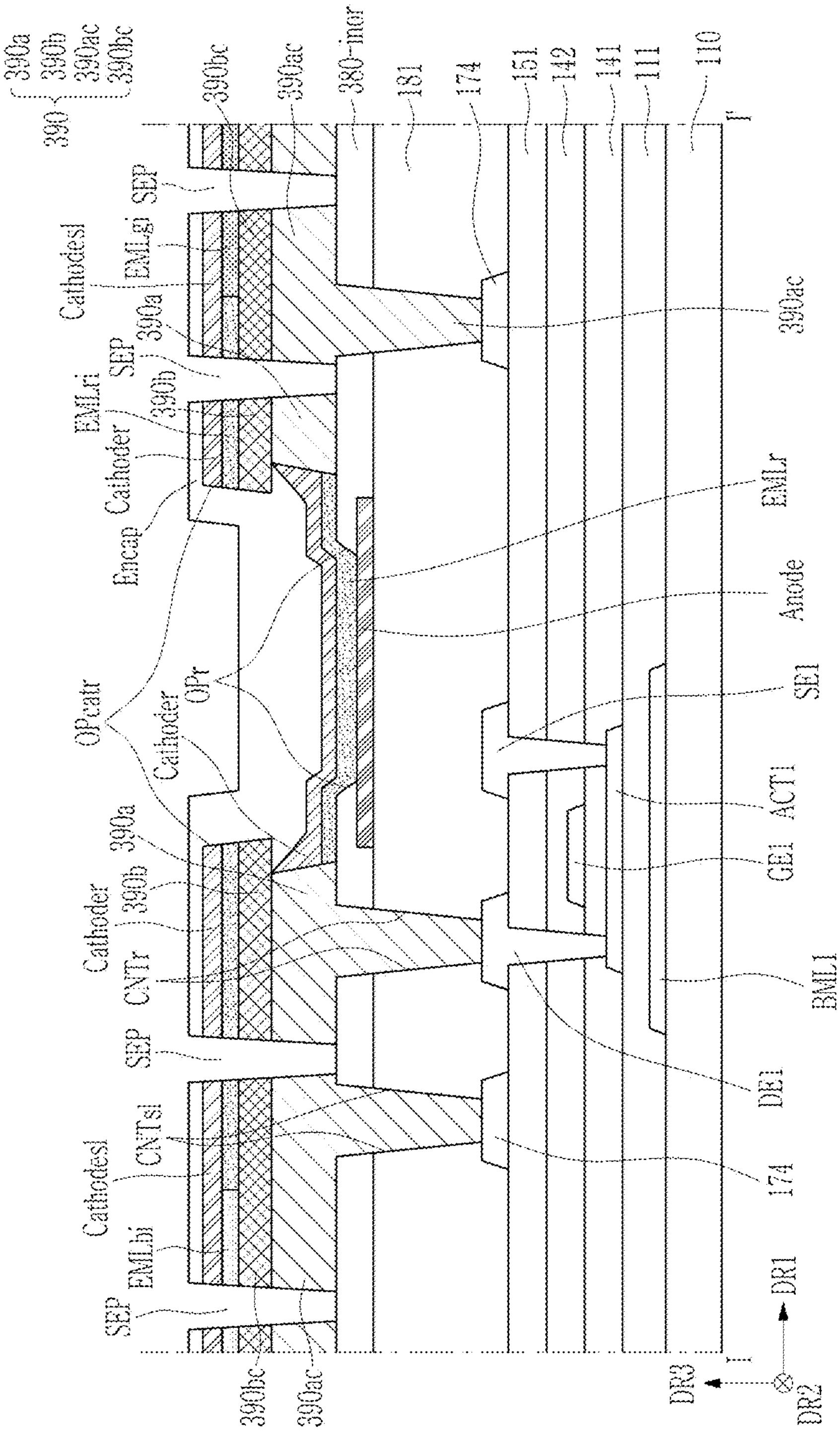
FIG. 5 is a schematic cross-sectional view taken along line I-I' of FIG. 4 illustrating the light emitting display device in the embodiment of FIG. 4.

The light emitting diode LED may include an anode connected to the driving voltage line 172, to which the driving voltage ELVDD is applied, and a cathode connected to the first electrode of the fifth transistor T5 and the second electrode of the seventh transistor T7. The cathode of the light emitting diode LED may be connected to the first transistor T1 through the fifth transistor T5, which is turned on by the light emission signal EM1. The light emitting diode LED may be disposed between the pixel driving part PC and the driving voltage ELVDD, so that the same current may flow through the first transistor T1 of the pixel driving part PC, and the luminance of the light emitting diode LED may be determined according to the magnitude of the current. A light emitting diode LED may include a light emitting layer including at least one of an organic light emitting material and an inorganic light emitting material disposed between an anode and a cathode. A specific stacked structure of a light emitting diode LED according to an embodiment may be as shown in FIG. 5 or the like.

The pixel PX according to the embodiment of FIG. 1 may perform a compensation operation to detect a change in the characteristics (e.g., threshold voltage) of the first transistor T1, so that the display brightness may be constant regardless of the change in the characteristics of the first transistor T1. For example, in FIG. 1, the light emitting diode LED may be disposed between the first electrode of the first transistor T1 and the driving voltage line 172.

The pixel PX according to this embodiment is also called an inverted pixel, which is distinguished from a pixel PX in which the light emitting element is disposed between the first transistor T1 and the driving low voltage ELVSS. The light emitting diode LED may display luminance according to the magnitude of the current flowing through the current path from the driving voltage ELVDD through the first transistor T1 to the driving low voltage ELVSS. Thus, as the current increases, the higher the displayed luminance may increase. In the inverted pixel structure of FIG. 1, the first electrode of the first transistor T1 may be connected to the light emitting diode LED and may be separated from the second electrode (e.g., source electrode) of the first transistor T1. This may have the advantage that the voltage of the second electrode (e.g., source electrode) of the first transistor T1 does not change in case that the voltage of each part of the pixel driving part PC changes.

In case that the sixth transistor T6 is turned on, the voltage of the second electrode of the first capacitor C1 decreases and the voltage of the first electrode of the first capacitor C1 also decreases, which causes the output current output by the first transistor T1 to be lowered, but in this embodiment, the problem of lowering the output current of the first transistor T1 may be prevented. This will be described in detail while explaining the operation of FIG. 2.

In the embodiment of FIG. 1, a pixel PX is described as including eight transistors T1 to T8 and two capacitors (e.g., the first capacitor C1 and the second capacitor C2), but embodiments are not limited thereto. In another example, additional capacitors or transistors may be included, and some capacitors or transistors may be omitted.

In the above, the circuit structure of the pixel PX was described through FIG. 1. Hereinafter, the waveform of the signal applied to the pixel PX of FIG. 1 and the operation of the pixel PX accordingly will be described in detail referring to FIG. 2.

Figure 2:
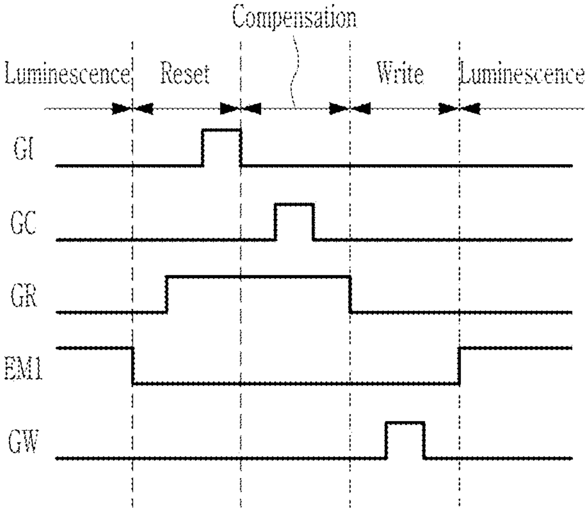
FIG. 2 is a waveform diagram showing a signal applied to the pixel of FIG. 1.

FIG. 2 is a waveform diagram showing a signal applied to the pixel PX of FIG. 1.

Referring to FIG. 2, in case that the signal applied to the pixel PX is divided into periods, it is divided into an initialization period, a compensation period, a writing period, and an emission period.

For example, the light emitting period may be the period where the light emitting diode LED emits light, and a gate-on voltage (e.g., high-level voltage) may be applied by the light emission signal EM1, turning on the fifth transistor T5 and the sixth transistor T6. For example, a gate-off voltage (e.g., low-level voltage) may be applied to the first scan signal GW, the second scan signal GC, the third scan signal GR, and the fourth scan signal GI. As a result, a current path may be formed between the driving voltage ELVDD and the driving low voltage ELVSS through the light emitting diode LED, the fifth transistor T5, the first transistor T1, and the sixth transistor T6. The magnitude of the current flowing through the current path may be determined by the degree to which the channel of the first transistor T1 is turned on, and the degree to which the channel of the first transistor T1 is turned on may be determined by the voltage of the gate electrode of the first transistor T1 (or the first electrode of the first capacitor C1). Therefore, the output current generated according to the voltage of the gate electrode of the first transistor T1 may flow along the current path including the light emitting diode LED such that the light emitting diode LED may emit light.

In FIG. 2, the light emitting period in which the light emission signal EM1 applies the gate-on voltage (e.g., low-level voltage) is shown, but the light emission period may have the longest time. However, since the light emitting period only performs the simple operations described above, it is simply depicted in FIG. 2. As the light emission signal EM1 changes to the gate-off voltage (e.g., low-level voltage), the light emission period may end and the initialization period may enter (or start).

Referring to FIG. 2, in the initialization period, the third scan signal GR may be changed to the gate-on voltage (e.g., high-level voltage), and then the fourth scan signal GI may be changed to the gate-on voltage (e.g., high-level voltage). For example, a gate-off voltage (e.g., low-level voltage) may be applied to the first scan signal GW, the second scan signal GC, and the light emission signal EM1.

For example, the fourth transistor T4 connected to the third scan signal GR, which is changed to a gate-on voltage (e.g., high-level voltage) and applied, may be turned on. Thus, the gate electrode of the first transistor T1 may be set by the reference voltage Vref, and the first electrode of the first capacitor C1 may be initialized by the reference voltage Vref. For example, the reference voltage Vref may have a voltage value capable of turning on the first transistor T1.

For example, the fourth scan signal GI may be also applied while being changed to a gate-on voltage (e.g., high-level voltage) to turn on the eighth transistor T8, and as a result, the second electrode of the first transistor T1, the second electrode of the sixth transistor T6, the second electrode of the first capacitor C1, and the second electrode of the second capacitor C2 may be initialized by the first initialization voltage Vint.

For example, the fourth scan signal GI may be changed to the gate-off voltage (e.g., low-level voltage) in case that the initialization period is ended, and the compensation period is started.

Referring to FIG. 2, in the compensation period, the third scan signal GR may maintain the gate-on voltage (e.g., high-level voltage) and the second scan signal GC may be changed to the gate-on voltage (e.g., high-level voltage). For example, a gate-off voltage (e.g., low-level voltage) may be applied to the first scan signal GW, the fourth scan signal GI, and the light emission signal EM1.

As the reference voltage Vref may continue to be transmitted to the gate electrode of the first transistor T1 and the first electrode of the first capacitor C1 through the turned-on fourth transistor T4, the third transistor T3 and the seventh transistor T7 may be also turned on by the second scan signal GC of the additionally applied gate-on voltage (e.g., high-level voltage), and the second initialization voltage Vcint may be transmitted to the first electrode of the first transistor T1 and the cathode of the light emitting diode LED.

For example, the first transistor T1 may be in the turned-on state due to the reference voltage Vref, so the Vgs value of the first transistor may be the same as the threshold voltage (Vth) value of the first transistor T1. For example, Vgs is a value obtained by subtracting the voltage of the second electrode (e.g., source electrode) of the first transistor T1 from the voltage of the gate electrode, so the voltage value of the second electrode (e.g., source electrode) of the first transistor T1 may have a voltage value (e.g., Vref-Vth) lower than the voltage of the gate electrode by the threshold voltage (Vth) of the first transistor T1. For example, the turned-on seventh transistor T7 may change the voltage level of the cathode to the driving voltage ELVDD, such that the voltage of the cathode may be initialized to the driving voltage ELVDD, thereby removing the remaining charge in the cathode Cathode and preventing the problem of not being able to display black.

For example, referring to FIG. 2, the second scan signal GC may be changed to the gate-off voltage (e.g., low-level voltage), and then the third scan signal GR may be also changed to the gate-off voltage (e.g., low-level voltage), and may enter (or start) the entry period. A gate-on voltage (e.g., high-level voltage) may be applied to the first scan signal GW in the writing period.

For example, the period during which the first scan signal GW is maintained at the gate-on voltage may be 1H. 1H represents 1 horizontal cycle, and 1 horizontal cycle may correspond to one horizontal synchronization signal (Hsync). 1H may mean the time for which the gate-on voltage is applied to the scan line of the next row after the gate-on voltage is applied to one scan line. For example, in the writing period, a gate-off voltage (e.g., low-level voltage) may be applied to the second scan signal GC, the third scan signal GR, and the light emission signal EM1.

In the writing period, the second transistor T2 to which the gate-on voltage (e.g., high-level voltage) is applied may be turned on, and all other transistors may be turned off. As a result, the data voltage VDATA may apply the pixel PX and may be applied to the gate electrode of the first transistor T1 and the first electrode of the first capacitor C1. For example, the voltage value of the second electrode of the first transistor T1 may be a voltage value (Vref-Vth) lower than the voltage of the gate electrode by the threshold voltage (Vth) of the first transistor T1, similar to the compensation period.

For example, the third transistor T3 and the fifth transistor T5 may be turned off, so the first electrode of the first transistor T1, the driving voltage line 172, and the light emitting diode LED may be electrically separated.

For example, referring to FIG. 2, the light emission signal EM1 may be changed to the gate-on voltage (e.g., high-level voltage), and the light emitting period may be entered or started. For example, a gate-off voltage (e.g., low-level voltage) may be applied to the first scan signal GW, the second scan signal GC, the third scan signal GR, and the fourth scan signal GI.

The fifth transistor T5 and the sixth transistor T6 may be turned on by the light emission signal EM1, and the light emitting diode LED, the fifth transistor T5, and the first transistor a current path may be formed through passing through the first transistor T1 and the sixth transistor T6 and connected to the driving low voltage ELVSS.

The magnitude of the current flowing through the current path may be determined by the degree to which the first transistor T1 is turned on, and the degree to which the first transistor T1 is turned on may be determined by the magnitude of the data voltage VDATA applied to the gate electrode. The light emitting diode LED may display brightness differently according to the magnitude of the current ($I_{OLED}$) flowing through the current path.

In the light emission period (e.g., the starting point of the light emission period), the sixth transistor T6 may be turned on, and as a result, the voltages of the second electrode of the first capacitor C1 and the second electrode of the first transistor T1 may be changed to the driving low voltage ELVSS. In case that the voltage value of the second electrode of the first capacitor C1 changes, the voltage value of the first electrode of the first capacitor C1 may be changed. For example, the voltage change value of the first electrode of the first capacitor C1 may be substantially equal to the voltage value of the second electrode of the first capacitor C1.

For example, in the writing period, the voltage values of the second electrode of the first transistor T1 and the second electrode of the first capacitor C1 may be changed from the reference voltage Vref value to the voltage value (Vref-Vth), which is obtained by subtracting the threshold voltage (Vth) of the first transistor T1 from the reference voltage Vref, so while changing from the writing period to the light emitting period, the change value of the voltage of the second electrode of the first capacitor C1 and the change value ΔV of the voltage of the first electrode of the first capacitor C1 are as shown in Equation 1 below.

$$\Delta V = V_{ELVSS} - (V_{ref} - V_{th}) \quad \text{[Equation 1]}$$

Here, Vref may be the voltage value of the reference voltage Vref, Vth may be the threshold voltage value of the first transistor T1, and ELVSS may be the voltage value of the driving low voltage ELVSS.

For example, the current ($I_{OLED}$) flowing through the light emitting diode LED in the light emitting period may be obtained using Equation 2 below.

$$\begin{aligned} I_{OLED} &= k/2 \times (Vgs - V_{th})^2 \quad \text{[Equation 2]} \\ &= k/2 \times [(V_{data} + \Delta V - V_{ELVSS}) - V_{th}]^2 \\ &= k/2 \times [(V_{data} + (V_{ELVSS} - Vref + V_{th}) - V_{ELVSS}) - V_{th}]^2 \\ &= k/2 \times (V_{data} - Vref)^2 \end{aligned}$$

Here, k may be a constant value, Vdata may be the voltage value of the data voltage, Vref may be the voltage value of the reference voltage Vref, Vth may be the threshold voltage value of the first transistor T1, and VELVSS may be the voltage value of the driving low voltage ELVSS, Vgs may be the voltage difference between the gate electrode and the second electrode of the first transistor T1, and ΔV may be the value of Equation 1.

Therefore, the value of the current ($I_{OLED}$) flowing through the light emitting diode LED may be determined only by the value of the data voltage VDATA and the reference voltage Vref, and may be independent of the threshold voltage (Vth) of the first transistor T1, so it may have the advantage of being able to generate a constant output current ($I_{OLED}$) despite changes in the characteristics of the first transistor T1.

For example, as the driving low voltage ELVSS is applied in the light emitting period, the voltage change value ΔV occurring at the gate electrode may be also removed as shown in Equation 1, so there may be no need to consider it separately, and only the data voltage VDATA value and the reference voltage Vref may need to be considered, which has the advantage that the current does not change according to the characteristics of the first transistor T1.

In the above, the voltage value of the driving voltage ELVDD may be set to be higher than the voltage value obtained by subtracting the threshold voltage value of the first transistor T1 from the reference voltage Vref, and the voltage value of the driving low voltage ELVSS may be set to be lower than the voltage value obtained by subtracting the threshold voltage value of the first transistor T1 from the reference voltage Vref.

In the above, the operation according to the pixel PX of FIG. 1 and the waveform of FIG. 2 was described.

Hereinafter, the circuit structures of a light emitting diode LED and a pixel driving part PC according to another embodiment will be described with reference to FIG. 3.

Figure 3:
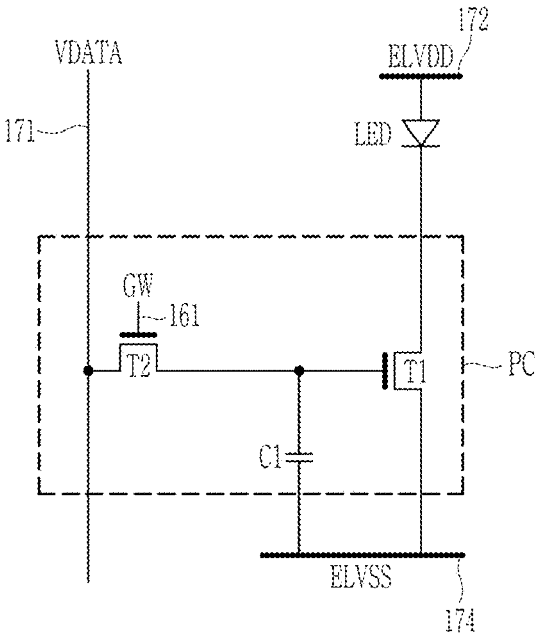
FIG. 3 is a schematic diagram of an equivalent circuit of a pixel included in a light emitting display device according to another embodiment.

FIG. 3 is a schematic diagram of an equivalent circuit of a pixel PX included in a light emitting display device according to another embodiment. Referring to FIG. 3, a pixel PX may include a light emitting diode LED and a pixel driving part PC that drives the pixel PX.

The pixel driving part PC may include all elements except the light emitting diode LED in FIG. 3, and the pixel driving part PC of the pixel PX according to the embodiment of FIG. 3 may include the first transistor T1, the second transistor T2, and the first capacitor C1.

For example, the pixel driving part PC may be connected to the first scan line 161 to which the first scan signal GW is applied and the data line 171 to which the data voltage VDATA is applied. For example, the pixel PX may be connected to a driving voltage line 172 to which a driving voltage ELVDD (e.g., first driving voltage) is applied, and a driving low-voltage line 174 to which a driving low voltage ELVSS (e.g., second driving voltage) is applied. The circuit structure of the pixel, focusing on each element (e.g., transistor, capacitor, light emitting element) included in the pixel PX, is as follows.

The first transistor T1 (e.g., driving transistor) may include a gate electrode connected to the first electrode of the first capacitor C1 and the second electrode of the second transistor T2, a first electrode (e.g., input side electrode) connected to the cathode of the light emitting diode LED, and a second electrode (e.g., output side electrode) that receives the driving low voltage ELVSS.

The degree to which the first transistor T1 may be turned on may be determined according to the voltage of the gate electrode, and the degree to which the first transistor T1 may be turned on may be determined by the current flowing from the first electrode of the first transistor T1 to the second electrode of the first transistor T1. The current flowing from the first electrode to the second electrode of the first transistor T1 may be the same as the current flowing through the light emitting diode LED and may also be referred to as light emission current. For example, the first transistor T1 may be formed as an n-type transistor, and the higher the voltage of the gate electrode, the larger the light emission current may flow. In case that the light emission current is large, the light emitting diode LED may display high luminance.

The second transistor T2 (e.g., data input transistor) may include a gate electrode connected to the first scan line 161 to which the first scan signal GW is applied, a first electrode (e.g., input side electrode) connected to a data line 171 to which the data voltage VDATA is applied, and a second electrode (e.g., output side electrode) connected to the first electrode of the first capacitor C1 and the gate electrode of the first transistor T1. The second transistor T2 may apply the data voltage VDATA into the pixel PX according to the first scan signal GW, and may apply the data voltage VDATA to the gate electrode of the first transistor T1, allowing the data voltage VDATA to be stored in the first electrode of the first capacitor C1.

All transistors may be formed as n-type transistors, and each transistor may be turned on in case that the voltage of the gate electrode is at a high level and turned off in case that the voltage at the gate electrode is at a low level. For example, the semiconductor layer included in each transistor may use a polycrystalline silicon semiconductor or an oxide semiconductor, and may use an amorphous semiconductor or a single crystal semiconductor.

According to the embodiment, the semiconductor layer included in each transistor may further include an overlapping layer (or additional gate electrode) that overlaps the gate electrode, and by applying a voltage to the overlapping layer (or additional gate electrode), the characteristics of the transistor may be changed to improve the display quality of the pixel.

The first capacitor C1 may include a first electrode connected to the gate electrode of the first transistor T1 and the second electrode of the second transistor T2, and a second electrode that receives the driving low voltage ELVSS. The first electrode of the first capacitor C1 may function to receive and store the data voltage VDATA from the second transistor T2. According to the embodiment, the second electrode of the first capacitor C1 may receive the driving voltage ELVDD.

The light emitting diode LED may include an anode that is connected to the driving voltage line 172 and receives the driving voltage ELVDD, and a cathode that is connected to the first electrode of the first transistor T1. The light emitting diode LED may be disposed between the pixel driving part PC and the driving voltage ELVDD, so that the same current may flow through the first transistor T1 of the pixel driving part PC, and the luminance of the light emitting diode LED may be determined according to the magnitude of the current. A light emitting diode LED may include a light emitting layer including at least one of an organic light emitting material and an inorganic light emitting material between an anode and a cathode. A specific stacked structure of a light emitting diode LED according to an embodiment may be as shown in FIG. 5 or the like.

For example, in FIG. 3, the light emitting diode LED may be disposed between the first electrode of the first transistor T1 and the driving voltage line 172. The pixel PX according to this embodiment is also called an inverted pixel PX to distinguish from a pixel PX in which the light emitting element is disposed between the first transistor T1 and the driving low voltage ELVSS. The light emitting diode LED may display luminance according to the magnitude of the current flowing through the current path from the driving voltage ELVDD through the first transistor T1 to the driving low voltage ELVSS. For example, as the current increases, the displayed luminance may increase.

In the embodiment of FIG. 3, a pixel PX is described as including two transistors T1 and T2 and one capacitor (e.g., first capacitor C1), but embodiments are not limited thereto, and according to the embodiment, capacitors or transistors may be included.

Hereinafter, pixels may be formed in the display area, and the planar structure of light emitting diodes and a pixel driving part PC according to an embodiment will be described referring to FIG. 4.

Figure 4:
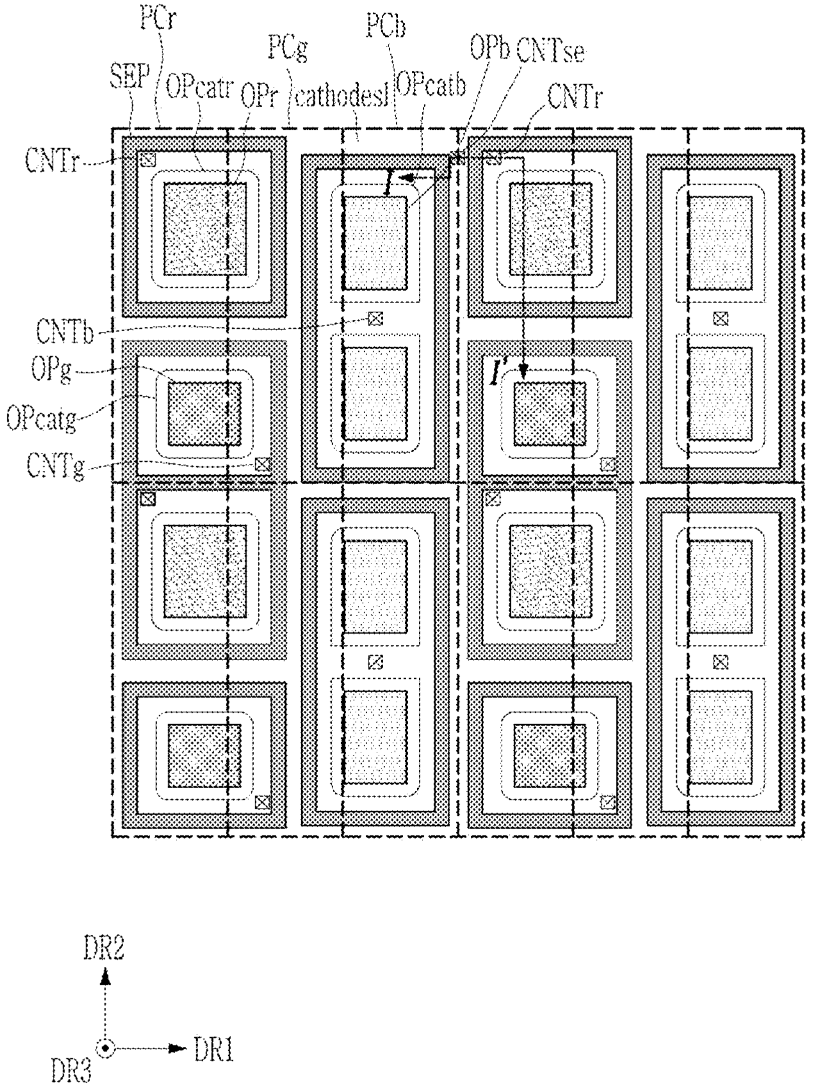
FIG. 4 is a schematic plan view showing the connection between a pixel driving part and a light emitting display device according to an embodiment.

FIG. 4 is a schematic plan view showing the connection between a pixel driving part and a light emitting diode according to an embodiment.

FIG. 4 shows a portion of the display area, and the light emitting area is an area where light is emitted by a light emitting diode LED, the light emitting diode LED may include light emitting diodes corresponding to the three primary colors of light, and the embodiment of FIG. 4 may include a red-light emitting diode, a green-light emitting diode, and a blue-light emitting diode.

Each light emitting diode LED may include an anode, a light emitting layer, and a cathode. Below each light emitting diode LED, pixel driving parts PCr, PCg, and PCb that are electrically connected to each emitting diode LED may be included. In FIG. 4, the pixel driving parts PCr, PCg, and PCb are shown as dotted lines and are alternately disposed in the order of the red pixel driving part PCr, the green pixel driving part PCg, and the blue pixel driving part PCb. The number and arrangement of such pixel driving parts PCr, PCg, and PCb may be changed in various ways.

The pixel driving parts PCr, PCg, and PCb may include a red pixel driving part PCr, a green pixel driving part PCg, and a blue pixel driving part PCb. The red pixel driving part PCr and the red-light emitting diode may be electrically connected through the red contact hole CNTr, and the green pixel driving part PCg and the green-light emitting diode may be electrically connected through the green contact hole CNTg, and the blue pixel driving part PCb, and the blue-light emitting diode may be electrically connected through the blue contact hole CNTb.

The light emitting diode LED may correspond to (or overlap) a light emitting area corresponding to the opening OPr, OPg, and OPb of the pixel defining layer (see 380-*inor* in FIG. 5). Hereinafter, the explanation will be based on the opening OPr, OPg, and OPb of the light emitting area or pixel defining film instead of the light emitting diode LED.

A wall (see 390 in FIG. 5) may be disposed on the pixel defining layer 380-*inor*, and the wall 390 may include openings OPcatr, OPcatg, and OPcatb corresponding to the openings OPr, OPg, and OPb of the pixel defining layer 380-*inor*. In FIG. 4, the openings OPcatr, OPcatg, and OPcatb of the wall 390 may overlap the openings OPr, OPg, and OPb of the pixel defining layer 380-*inor* and may be formed to be larger. According to the embodiment, the openings OPr, OPg, and OPb of the pixel defining layer 380-*inor* may be formed larger than the openings OPcatr, OPcatg, and OPcatb of the wall 390.

The wall 390 may be formed to include at least two layers made of a conductive material. The wall 390 may have a tip structure (e.g., protruding tip structure or tip portion), and the tip structure may be disposed in the uppermost layer of the wall 390. Due to this tip structure, the layer disposed on the top (or upper surface) of the wall 390 may be physically broken without an additional etching process.

Figure 9:
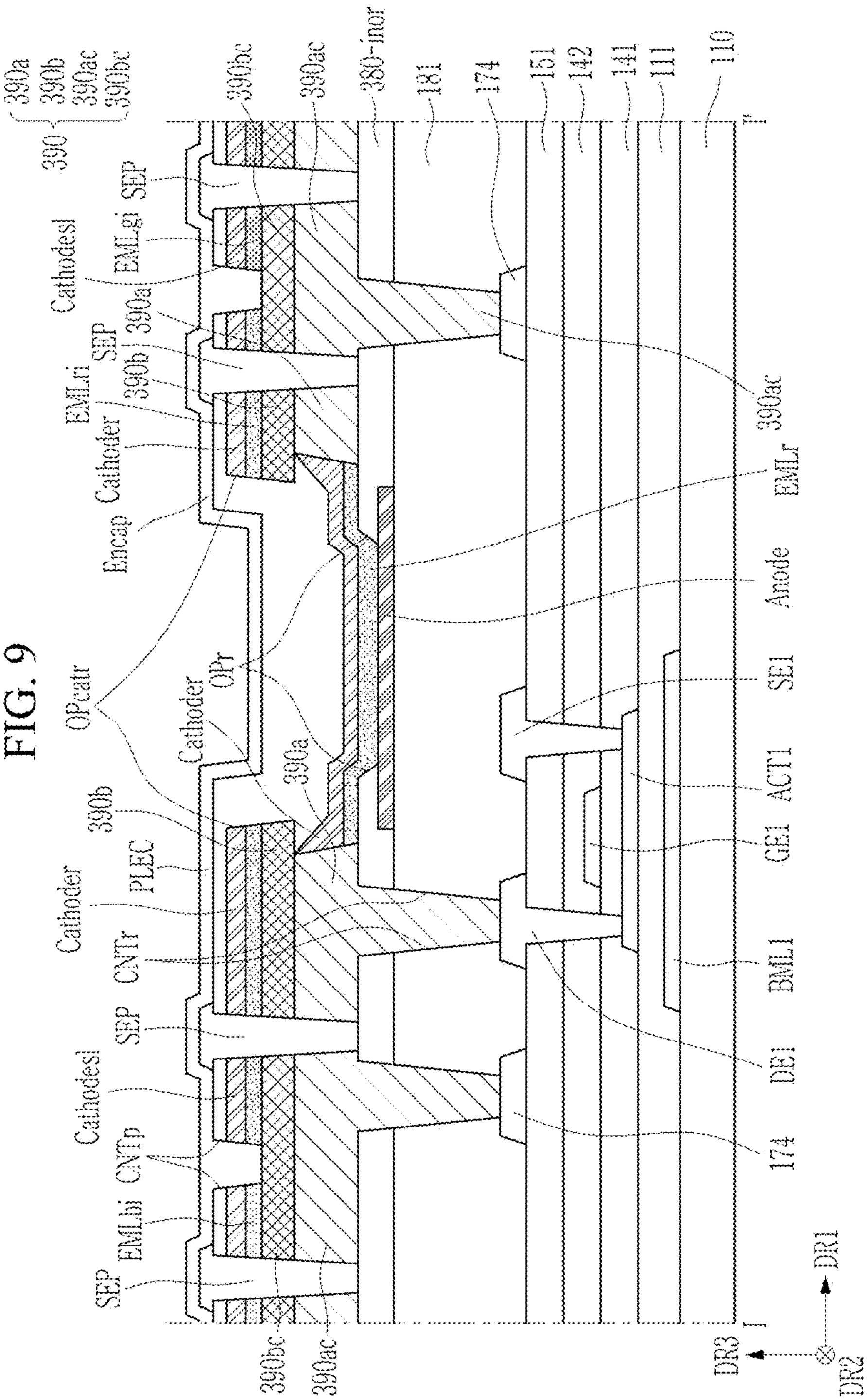

A separator SEP forming a closed curve may be formed outside the openings OPcatr, OPcatg, and OPcatb of the wall 390. The separator SEP may be formed in (or may pass through) the wall 390, and may be formed as an empty space within the wall 390, as shown in FIG. 5, or the space may be filled with an insulating material, as shown in FIG. 9. The separator SEP may be formed so that the conductive wall 390 may be electrically disconnected. The separator SEP may be formed up to the encapsulation layer (see Encap in FIG. 5) disposed on top (or upper surface) of the wall 390, and may also be disposed in a layer between the encapsulation layer Encap and the wall 390.

The pixel defining layer's openings OPr, OPg, and OPb and the wall's openings OPcatr, OPcatg, and OPcatb may be disposed inside the separator SEP, forming a closed curve. The cathode of the light emitting diode LED may be also disposed inside the separator SEP, and adjacent cathodes may be electrically separated by the separator SEP. The cathode disposed inside the separator SEP may be electrically connected to at least a portion of the wall 390 surrounding the cathode, and the wall 390 may be connected to the transistor and contact holes CNTr, CNTg, and CNTb disposed in the pixel driving part PCr, PCg, and PCb, so that the output current of the pixel driving parts PCr, PCg, and PCb may be transmitted to the cathode of the light emitting diode LED.

Contact holes CNTr, CNTg, and CNTb may be also disposed in the pixel defining layer 380-*inor* to electrically connect the wall 390 and the pixel driving part PCr, PCg, and PCb. For example, according to the embodiment, the wall 390 may be electrically connected to the anode, which is an electrode of the light emitting diode. The specific stacked structure of the wall 390, pixel defining layer 380-*inor*, and separator SEP will be described in detail in FIG. 5, etc.

For example, a separated cathode Cathodesl may be formed entirely outside the separator SEP, and may be formed over the entire display area. According to the embodiment, a voltage having a constant voltage level (for example, driving low voltage ELVSS) may be applied to the separated cathode Cathodesl. The separated cathode Cathodesl may have a mesh structure. The separated cathode Cathodesl may be electrically separated from the cathodes by a separator SEP.

Referring to embodiment of FIG. 4, the red opening OPr of the pixel defining layer 380-*inor* corresponding to the red-light emitting area, and the green opening OPg of the pixel defining layer 380-*inor* corresponding to the green-light emitting area, are each formed within a separator SEP (e.g., single separator). However, the blue opening OPb of the pixel defining layer 380-*inor* corresponding to the blue-light emitting area may be formed in multiples within a single separator SEP, and in the embodiment of FIG. 4, two blue openings (OPb; each corresponding to a light emitting area) are included. For example, only one cathode included in the blue-light emitting diode LED may be formed corresponding to the two blue openings OPb, and this is because the cathodes are separated by the separator SEP. For example, a cathode included in the blue-light emitting diode LED may be electrically connected by a contact hole CNTb to the blue pixel driving part PCb, and the output current of the blue pixel driving part PCb may be transmitted through two blue openings OPb.

For example, in FIG. 4, adjacent separators SEP may be separated from each other. However, according to the embodiment, some adjacent separators SEP may have a connected structure.

The cross-sectional structure of the structure of FIG. 4 as described above will be described in detail referring to FIG. 5.

FIG. 5 is a schematic cross-sectional view taken along line I-I' of FIG. 4 illustrating the light emitting display device in the embodiment of FIG. 4.

In FIG. 5, the red pixel may be centered, and the red pixel driving part PCr may be connected to the cathode of the light emitting diode LED through the contact hole CNTr, and the structure in which the driving low voltage ELVSS is applied to the separated cathode Cathodesl is detailed.

In FIG. 5, the structure disposed below the planarization layer 181 is shown only briefly, and only one transistor is shown. A brief look at the structure from the substrate 110 to the planarization layer 181 is as follows.

The substrate 110 may include a material that has rigid properties and may not bend, such as glass, or may include a flexible material that is bendable, such as plastic or polyimide. In the case of a flexible substrate, it may have a structure in which a two-layer structure of polyimide and a barrier layer formed on the inorganic insulating material are repeatedly formed.

A lower shielding layer BML1 including metal may be disposed on the substrate 110, and the lower shielding layer BML1 may overlap in plan the channel of the transistor disposed in the pixel driving parts PCr, PCg, and PCb included in the display unit. According to the embodiment, the lower shielding layer BML1 may be omitted.

The substrate 110 and the lower shielding layer BML1 may be covered by the buffer layer 111. The buffer layer 111 may function to block impurities from penetrating into the first semiconductor layer ACT1, and may be an inorganic insulating layer including silicon oxide ($SiO_x$), silicon nitride ($SiN_x$), or silicon oxynitride ($SiON_x$).

A first semiconductor layer ACT1 formed of polycrystalline silicon semiconductor (P—Si) or an oxide semiconductor may be disposed on the buffer layer 111. The first semiconductor layer ACT1 may be a semiconductor layer disposed in the pixel driving part PCr, PCg, and PCb included in the display unit, and may include the channel of the transistor including the driving transistor and the first and second regions disposed on sides (e.g., opposite sides) of the channel. For example, the transistor may be a driving transistor included in the pixel driving part PCr, PCg, and PCb or another switching transistor.

For example, the first semiconductor layer ACT1 may include regions on sides (e.g., opposite sides) of the channel that have conductive layer characteristics through plasma treatment or doping, and may function as the first and second electrodes of the transistor.

A first gate insulating layer 141 may be disposed on the first semiconductor layer ACT1. The first gate insulating layer 141 may be an inorganic insulating layer including silicon oxide ($SiO_x$), silicon nitride ($SiN_x$), or silicon oxynitride ($SiON_x$). A first gate conductive layer including the gate electrode GE1 of the transistor disposed in the red pixel driving part PCr may be disposed on the first gate insulating layer 141.

The first gate conductive layer may include a scan line, an emission control line, or a first electrode of a capacitor disposed in the red pixel driving part PCr, in addition to the gate electrode GE1 of the transistor disposed in the red pixel driving part PCr.

After forming the first gate conductive layer, a plasma treatment or doping process may be performed to make the exposed area of the first semiconductor layer to be conductive. For example, the first semiconductor layer ACT1 covered by the gate electrode GE1 may not be conductive, and the portion of the first semiconductor layer ACT1 not covered by the gate electrode GE1 may have the same characteristics as the conductive layer.

A second gate insulating layer 142 may be disposed on the first gate conductive layer and the first gate insulating layer 141. The second gate insulating layer 142 may be an inorganic insulating layer including silicon oxide ($SiO_x$), silicon nitride ($SiN_x$), or silicon oxynitride ($SiON_x$). A second gate conductive layer including a second electrode of a capacitor disposed in the red pixel driving part PCr may be disposed on the second gate insulating layer 142.

The second electrode of the capacitor may overlap the first electrode of the capacitor or the gate electrode GE1 to form a capacitor disposed in the red pixel driving part PCr, and the first electrode of the capacitor may overlap the gate electrode GE1 of the driving transistor, or it may be electrically connected or formed as one piece.

A first interlayer insulating layer 151 may be disposed on the second gate conductive layer. The first interlayer insulating layer 151 may include an inorganic insulating layer including silicon oxide ($SiO_x$), silicon nitride ($SiN_x$), or silicon oxynitride ($SiON_x$). According to the embodiment, the inorganic insulating material may be formed thickly.

A first data conductive layer including connection electrodes SE1 and DE1 and a driving low-voltage line 174 may be disposed on the first interlayer insulating layer 151. The first data conductive layer may include a metal or metal alloy such as aluminum (Al), copper (Cu), molybdenum (Mo), titanium (Ti), and may be composed of a single layer or multiple layers.

For example, the connection electrodes SE1 and DE1 may be connected to the transistor included in the red pixel driving part PCr, and e.g., the connection electrode SE1 connected to a first region of the first semiconductor layer may be connected to the first region of the first semiconductor layer ACT1, and the connection electrode DE1 connected to the second region of the first semiconductor layer ACT1. For example, the connection electrode DE1 may be connected to the cathode through the wall 390.

For example, the first data conductive layer may further include a driving low-voltage line 174. The driving low-voltage line 174 may transmit the driving low voltage ELVSS and may be transmitted to the separated cathode Cathodesl through the wall 390.

According to the embodiment, the driving low-voltage line 174 may be formed of a lower shielding layer or a first gate conductive layer. For example, a connection electrode that transmits the driving low voltage ELVSS may be disposed in the first data conductive layer. For example, according to the embodiment, the first driving low-voltage line may be disposed in the first data conductive layer, and the second driving low-voltage line may be disposed in the lower shielding layer or the first gate conductive layer. For example, the extension direction of the first driving low-voltage line may be perpendicular to the extension direction of the second driving low-voltage line, the extension direction of the first driving low-voltage line may be in the second direction DR2, and the extension direction of the second driving low-voltage line may be in the first direction DR1.

A planarization layer 181 may be disposed on the first data conductive layer. The planarization layer 181 may be an organic insulating layer including an organic material, and the organic material may include one or more materials selected from the group consisting of polyimide, polyamide, acrylic resin, benzocyclobutene, and phenol resin.

The pixel driving part PC as described above may be formed on the substrate 110, and the planarization layer 181 may cover the top (or upper surface) of the pixel driving part PC.

A structure including a light emitting diode LED and a separator SEP may be formed on the planarization layer 181. The structure above the planarization layer 181 in detail is as follows.

An anode Anode may be formed on the planarization layer 181. The anode Anode may form an electrode of the light emitting diode LED, and in an embodiment where the light emitting diode LED has an inverted pixel structure, the driving voltage ELVDD may be applied to the anode Anode. For example, the anode Anode may be electrically connected to or may be integral with the driving voltage line 172 to which the driving voltage ELVDD is applied. For example, the same driving voltage ELVDD may be applied to all anodes.

A pixel defining layer 380-*inor* having a red opening OPr that overlaps at least a portion of the anode Anode may be disposed on the planarization layer 181 and the anode. The pixel defining layer 380-*inor* may be composed of an inorganic insulating layer including an inorganic insulating material, the inorganic insulating materials making up the pixel defining layer 380-*inor* may include silicon oxide ($SiO_x$), silicon nitride ($SiN_x$), or silicon oxynitride ($SiON_x$), and the pixel defining layer 380-*inor* may have a multilayer structure including a plurality of layers made of an inorganic insulating material.

The planarization layer 181 and the pixel defining layer 380-*inor* may include contact holes CNTr and CNTsl that expose at least a portion of the pixel driving part PC disposed below the planarization layer 181. Referring to FIG. 5, the cathode contact hole (CNTr; hereinafter also referred to as the first opening or first contact hole) may be formed in (or may pass through) the pixel defining layer 380-*inor* and the planarization layer 181, and may be included in the pixel driving part PC. It may overlap in a plan view a portion of the connection electrode DE1 that is electrically connected to an electrode of the transistor. For example, the contact hole (CNTsl; hereinafter also referred to as the second opening or second contact hole) for voltage transmission may be formed in (or may pass through) the pixel defining layer 380-*inor* and the planarization layer 181 to provide a driving low voltage disposed in the pixel driving part PC, and the contact hole CNTsl may overlap a portion of the driving low-voltage line 174 in a plan view.

A wall 390 may be disposed on the pixel defining layer 380-*inor*, and the wall 390 may include an opening OPcatr corresponding to the red opening OPr of the pixel defining layer 380-*inor*, and may also include a portion of a separator SEP. For example, the opening OPcatr of the wall 390 may overlap the red opening OPr of the pixel defining layer 380-*inor* in a plan view and may be formed to be larger.

The wall 390 may be formed to include at least two layers made of a conductive material, and the conductive material forming the wall 390 may include various metals and alloys thereof. The wall 390 may include a metal or metal alloy such as aluminum (Al), copper (Cu), molybdenum (Mo), titanium (Ti), etc. The embodiment of FIG. 5 may include lower conductive walls 390*a* and 390*ac* (hereinafter also referred to as first conductive walls) and upper conductive walls 390*b* and 390*bc* (hereinafter also referred to as second conductive walls), and the lower conductive wall 390*a* and 390*ac* may be formed of a metal including aluminum (Al), and the upper conductive walls 390*b* and 390*bc* may be formed of a metal including titanium (Ti). The lower conductive walls 390*a* and 390*ac* and the upper conductive walls 390*b* and 390*bc* may be in contact with each other, and are divided into inner conductive walls (or first/inner walls) 390*a* and 390*b* and outer conductive walls (or second/outer walls) 390*ac* and 390*bc*, which are electrically separated. For example, the inner conductive walls 390*a* and 390*b* are parts that comprise and surround the opening OPcatr of the wall 390, and the outer conductive walls 390*ac* and 390*bc* are parts separated from the opening OPcatr of the wall 390. The inner conductive walls 390*a* and 390*b*, and the outer conductive walls 390*ac* and 390*bc* may be electrically separated by a separator SEP, and the outer conductive walls 390*ac* and 390*bc* may have a structure connecting the entire area.

The inner conductive walls 390*a* and 390*b* may be divided into a lower inner conductive wall 390*a* (hereinafter referred to as the first inner conductive wall) and an upper inner conductive wall 390*b* (hereinafter referred to as the second inner conductive wall), the outer conductive walls 390*ac* and 390*bc* may be divided into a lower outer conductive wall 390*ac* (hereinafter referred to as the first outer conductive wall) and an upper outer conductive wall 390*bc* (hereinafter referred to as the second outer conductive wall).

The lower conductive walls 390*a* and 390*ac* may be in contact with the upper conductive walls 390*b* and 390*bc*, and the side surfaces of the lower conductive walls 390*a* and 390*ac* may coincide (or be aligned) with the side surfaces of the upper conductive walls 390*b* and 390*bc*. The side surfaces of the lower conductive walls 390*a* and 390*ac* and the side surfaces of the upper conductive walls 390*b*, 390*bc* may not coincide (or may not be aligned with) around the opening OPcatr of the wall 390. For example, among the inner conductive walls 390*a* and 390*b*, the opening OPcatr side of the wall 390 may have a tip structure in which the upper inner conductive wall 390*b* protrudes more than the lower inner conductive wall 390*a*. Referring to FIG. 5, the side of the lower inner conductive wall 390*a* may have a structure in contact with the cathode Cathoder and may be electrically connected. For example, according to the embodiment, the side surfaces of the lower conductive walls 390*a* and 390*ac* may not coincide (or may not be aligned) with the side surfaces of the upper conductive walls 390*b* and 390*bc*.

The inner conductive walls 390*a* and 390*b* may be electrically connected to the connection electrode DE1, which is electrically connected to an electrode of a transistor included in the pixel driving part PC, through a cathode contact hole CNTr formed in the pixel defining layer 380-*inor* and the planarization layer 181. As a result, the output current of the pixel driving part PC may be transmitted to the cathode through the inner conductive walls 390*a* and 390*b*.

The outer conductive walls 390*ac* and 390*bc* may be electrically connected to the driving low-voltage line 174 disposed in the pixel driving part PC through the contact hole CNTsl for voltage transmission formed in the pixel defining layer 380-*inor* and the planarization layer 181. As a result, the driving low voltage ELVSS may be applied to the outer conductive walls 390*ac* and 390*bc*.

It is inside the opening OPcatr of the wall 390, and the light emitting layer EMLr may be disposed on the anode. For example, on the upper conductive walls 390*b* and 390*bc*, a separated light emitting layer EMLri and/or isolated light emitting layers EMLgi, and EMLbi formed of the same material as the light emitting layer EMLr disposed in the opening OPcatr of the adjacent wall 390 but separated from it and/or corresponding to a different color than the light emitting layer EMLr disposed within the opening OPcatr. For example, only the separated light emitting layer EMLri formed of the same material as the light emitting layer EMLr disposed in the opening OPcatr of the adjacent wall 390 may be disposed on the upper inner conductive wall 390*b*, but separated light emitting layer EMLgi, and EMLbi corresponding to a different color from the light emitting layer EMLr disposed in the opening OPcatr may also be disposed on top (or upper surface) of the upper outer conductive wall 390*bc*.

The light emitting layer EMLr and separated light emitting layers EMLri, EMLgi, and EMLbi disposed within the opening OPcatr of the wall 390 may be separated by a tip structure with the upper inner conductive wall 390*b* protruding above the lower inner conductive wall 390*a*, without a separate etching process.

The cathode Cathoder may be within the opening OPcatr of the wall 390, and above the light emitting layer EMLr. For example, a separated cathode Cathodesl formed of the same material as the cathode Cathoder may be disposed on the separated light emitting layer EMLri, EMLgi, and EMLbi.

The separated cathode Cathodesl may be separated without a separate etching process using a tip structure in which the upper inner conductive wall 390*b* protrudes above the lower inner conductive wall 390*a*.

The separated light emitting layer EMLri, EMLgi, and EMLbi and the separated cathode Cathodesl may be disposed on the entire area of the upper conductive walls 390*b* and 390*bc*, and may also be disposed on the tip structure of the protruding upper inner conductive wall 390*b*. The same voltage as that of the wall 390 adjacent thereto may be applied to the separated light emitting layers EMLri, EMLgi, and EMLbi and the separated cathode Cathodesl. For example, the part of the separated cathode Cathodesl disposed above the inner conductive walls 390*a* and 390*b* may be electrically connected to the cathode Cathoder through the inner conductive walls 390*a* and 390*b* and the separated light emitting layers EMLri, EMLgi, and EMLbi, and may be connected to receive the output current of the pixel driving part PC, and the part of the separated cathode Cathodesl disposed above the outer conductive walls 390*ac* and 390*bc* may be connected to the outer conductive wall 390*ac* and 390*bc* and the separated light emitting layer EMLri, and the driving low voltage ELVSS may be transmitted through the separated light emitting layers EMLgi, and EMLbi.

For example, the angle at which the light emitting layer material is stacked may be different from the angle at which the cathode material is stacked, and the angle at which the cathode material is stacked with respect to the third direction DR3 is the direction at which the light emitting layer material is stacked, and it may be larger than the angle formed with respect to the third direction DR3. As a result, the material for the light emitting layer EML may be formed by covering a large area by the tip structure of the upper inner conductive wall 390*b*, and the material of the cathode Cathoder may be formed by covering a relatively narrow area. Therefore, as shown in FIG. 5, the light emitting layer EMLr disposed within the opening OPcatr of the wall 390 may not be formed entirely on the side of the lower inner conductive wall 390*a*, but may be disposed centered on the anode, the cathode Cathoder may be in contact with the side of the lower inner conductive wall 390*a* to be electrically connected to each other. By adjusting the angle of forming the cathode material, unlike FIG. 5, the separated cathode Cathodesl may be formed to have a structure that is connected to the cathode Cathoder rather than being separated from the cathode Cathoder.

The separated light emitting layers EMLri, EMLgi, and EMLbi and the separated cathodes Cathodesl may be separated by a separator SEP, and the separator SEP according to the embodiment of FIG. 5 may include a wall 390, a separated light emitting layer EMLri, EMLgi, and EMLbi, a separated cathode Cathodesl, and an encapsulation layer Encap.

For example, referring to the embodiment of FIG. 5, an encapsulation layer Encap may be formed on the cathode Cathoder and separated cathode Cathodesl, and after the encapsulation layer Encap is formed, a separator SEP may be formed through an etching process. The separator SEP may function to separate the conductive walls 390, and may span (or extend along) the encapsulation layer Encap, the separated cathode Cathodesl, the separated light emitting layer EMLri, EMLgi, and EMLbi, and the wall 390, and may additionally be formed in a portion of the pixel defining layer 380-*inor.*

The separator SEP according to the embodiment of FIG. 5 may be formed as an empty space.

However, according to the embodiment, the separator SEP may fill the empty space with an insulating material, and according to the embodiment, the separator SEP may not be formed in the encapsulation layer Encap. Although a void is created in a part of the encapsulation layer Encap by the separator SEP, in this embodiment, the wall 390 may be formed of a conductive material, such that air or moisture may be prevented from penetrating into the light emitting layer EMLr, thus reducing the likelihood of deterioration of the light emitting layer's characteristics. In the embodiment of FIG. 5, the encapsulation layer Encap is shown to be relatively thin, but it may be formed partially thin because it is etched to form the separator SEP, and according to the embodiment, it may be formed thicker than shown in the drawing.

Other features of the embodiments shown in FIGS. 4 and 5 above will be described in detail through FIG. 6 and FIGS. 7A and 7B.

Figure 6:
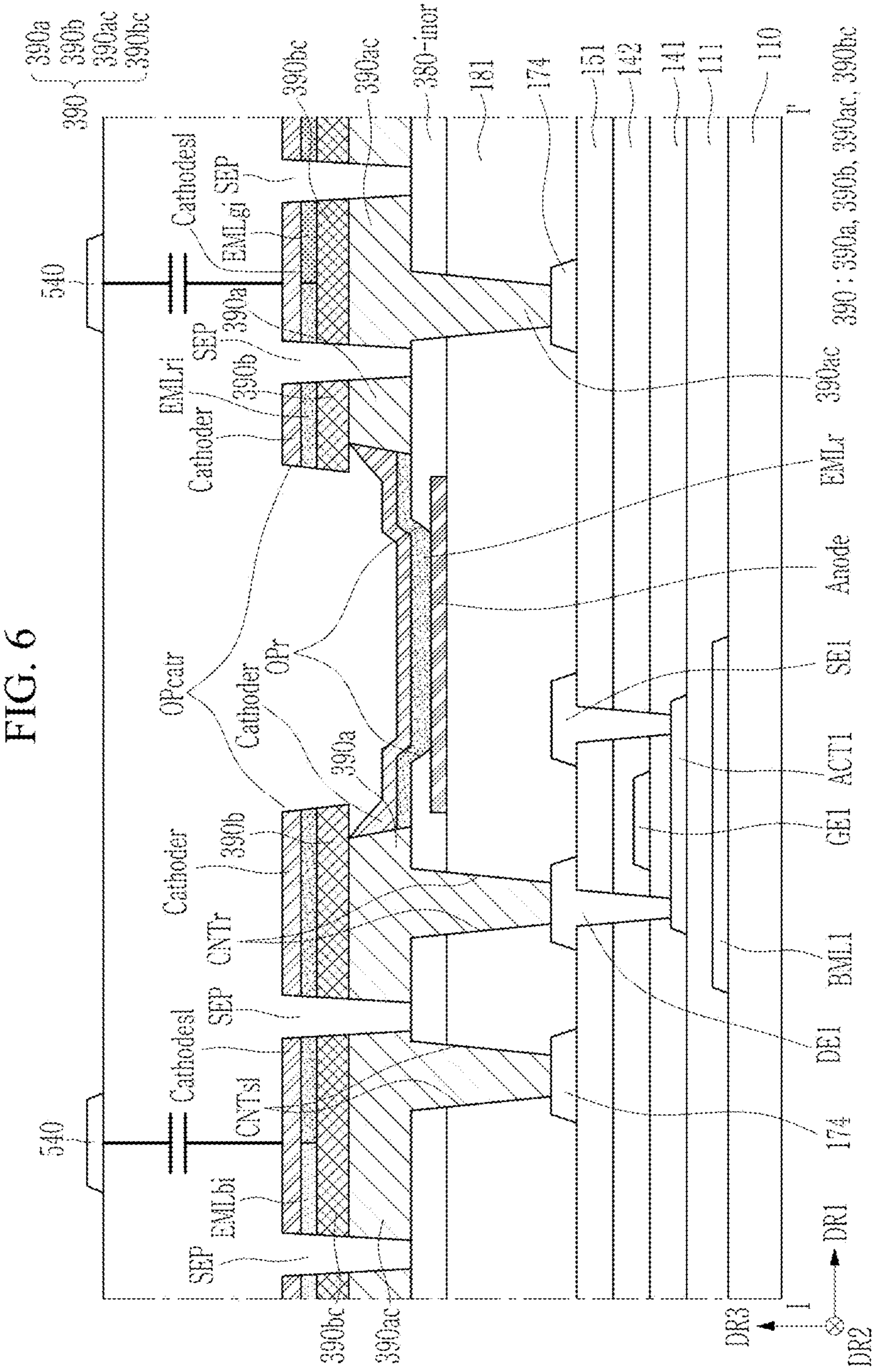
FIG. 6 and FIGS. 7A and 7B are schematic diagrams showing the effect of the embodiment of FIG. 3 and FIG. 4.

FIGS. 6 and 7 are schematic diagrams showing the effect of the embodiment of FIG. 3 and FIG. 4.

For example, in FIG. 6, the separated cathode Cathodesl disposed on the outer conductive walls 390*ac* and 390*bc* may be disposed on the encapsulation layer Encap, and may include a capacitance with the sensing electrode 540 that allows the light emitting display device to detect a touch. The forming structure is shown. In FIG. 6, the sensing electrode 540 is shown as in case of floating in the air, but this is because intervening layers are omitted, and an encapsulation layer and various insulating layers may be disposed between them.

As shown in FIG. 6, a sensing electrode 540 for detecting a touch may be disposed on the front of the light emitting display device. The sensing electrode 540 may be connected to the inner conductive walls 390*a* and 390*b* and a separated cathode disposed thereon, to prevent problems caused by changes in the output current of the pixel driving part PC. For example, a voltage with a constant voltage level may be applied to the outer conductive walls 390*ac* and 390*bc* and the separated cathode Cathodesl disposed thereon. For example, by applying a driving low voltage ELVSS, the voltage fluctuation of the sensing electrode 540 may be reduced and noise may be prevented from entering from the outside. As a result, the sensing operation of the light emitting display device may have the advantage of becoming more accurate.

Figure 7A:
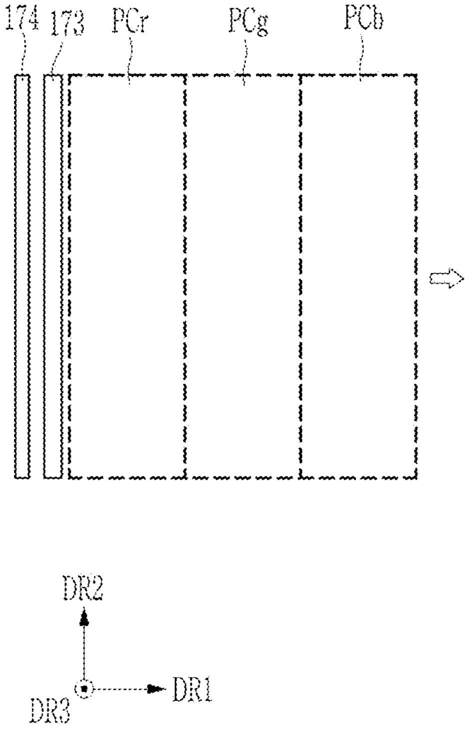
Figure 7B:
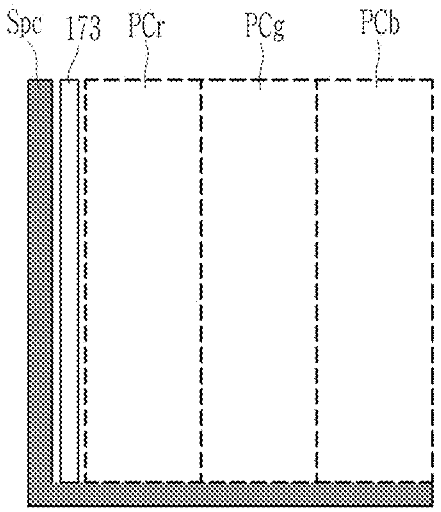

For example, in FIGS. 7A and 7B, in this embodiment, the voltage may be applied through the outer conductive walls 390*ac* and 390*bc*, which are part of the wall 390, instead of the voltage line, so the voltage line disposed adjacent to the pixel driving part PC may be used. The advantage of increasing resolution in the same area by removing it is described.

For example, FIG. 7A shows a comparative example, and FIG. 7B shows an embodiment.

In FIG. 7A, which is a comparative example, the reference voltage line 173 and the driving low-voltage line 174 extending in the second direction DR2 and three pixel driving parts PCr, PCg, and PCb are shown.

In the embodiment of FIG. 7B, the driving low-voltage line 174 may be omitted, and the corresponding portion may form a spare space Spc. Since the corresponding spare space Spc is removed, adjacent pixel driving parts PCr, PCg, and PCb may be formed to be disposed closer together. As a result, a light emitting display device having the same area may be formed to have higher resolution.

For example, referring to FIG. 7B, the spare space Spc may extend in the first direction DR1. This may include a first voltage line to which the same voltage is applied extending in the second direction DR2 and a second voltage line extending in the first direction DR1. For example, the first voltage line and the second voltage line may be disposed in (or formed as) different conductive layers. For example, the driving low-voltage line 174 may be divided into a first driving low-voltage line extending in the second direction DR2 and a second driving low-voltage line extending in the first direction DR1. The first driving low-voltage line may be disposed in (or formed as) the first data conductive layer, and the second driving low-voltage line may be disposed in (or formed as) the lower shielding layer.

In this embodiment, both voltage lines may be removed, and as a result, the spare space Spc extending in the first direction DR1 may be removed and formed to have increased density. As a result, a light emitting display device having the same area may be formed to have higher resolution.

In the above, attention was focused on the embodiments of FIG. 4 and FIG. 5.

Hereinafter, various modified embodiments will be looked at through FIG. 8 to FIG. 12.

Figure 8:
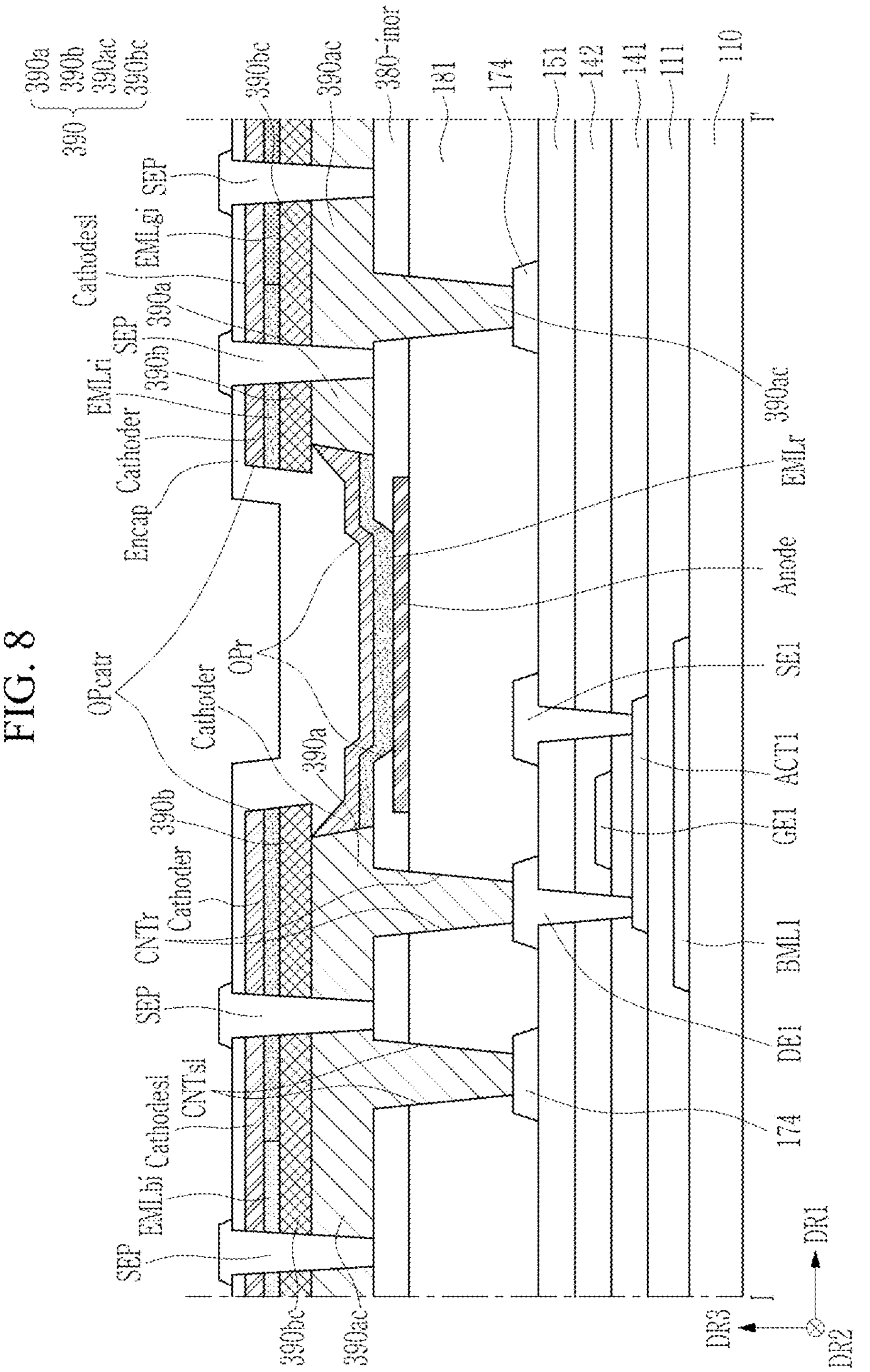
FIGS. 8, 9, and 10 are schematic cross-sectional views taken along line I-I' of FIG. 4 illustrating a light emitting display device according to other embodiments.
Figure 10:
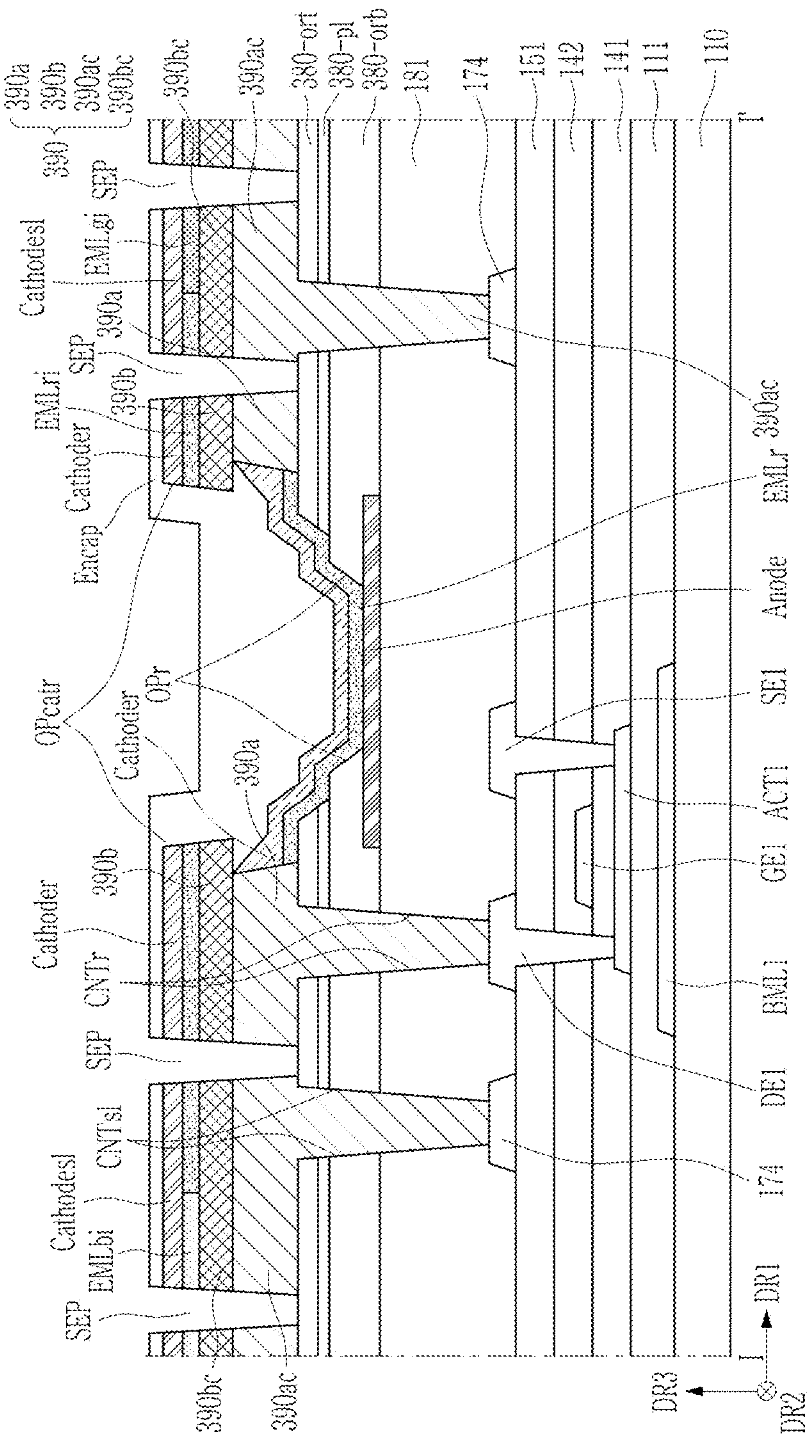

FIG. 8 to FIG. 10 are schematic cross-sectional views taken along line I-I' of FIG. 4 illustrating a light emitting display device according to other embodiments.

The embodiment of FIG. 8 will be described.

FIG. 8 is a modified example of FIG. 5, and unlike the embodiment of FIG. 5, the separator SEP may not be formed as an empty space, but the space may be filled with an organic material.

In the embodiment of FIG. 8, the separator SEP may be formed in a pillar shape of an organic material. In another example, the separator SEP may be formed of an inorganic material rather than an organic material. According to the separator SEP of FIG. 8, the characteristics of blocking moisture or air from flowing into the light emitting layer EML may be further improved compared to the separator SEP formed as an empty space. For example, although the separator SEP is formed in the encapsulation layer Encap, compared to the separator SEP in FIG. 5, which is an empty space in case of being filled with an insulating material, no air or moisture may permeate into the separator SEP, so the separator SEP may have features that make it easy to protect the light emitting layer.

Below, the embodiment of FIG. 9 will be described.

In the embodiment of FIG. 9, a transparent electrode PLEC may be additionally formed on the encapsulation layer Encap and the separator SEP that is filled with an insulating material as shown in FIG. 8. For example, the transparent electrode PLEC may be formed of a transparent conductive material, such as indium tin oxide (ITO), poly-ITO, indium zinc oxide (IZO), indium gallium zinc oxide (IGZO) and indium tin zinc oxide (ITZO).

A transparent electrode PLEC may be formed over the entire surface. The transparent electrode PLEC may be electrically connected to the outer conductive walls 390*ac* and 390*bc* through the opening CNTp passing through the separated light emitting layers EMLri, EMLgi, and EMLbi, the separated cathode Cathodesl, and the encapsulation layer Encap.

Since the outer conductive walls 390*ac* and 390*bc* are connected to the driving low-voltage line 174 through the contact hole CNTsl, the driving low voltage ELVSS may be applied to the transparent electrode PLEC.

According to the embodiment shown in FIG. 9, noise, which affects the sensing electrode (refer to 540 in FIG. 6), may be completely shielded or blocked by transparent electrode PLEC receiving the driving low voltage ELVSS. For example, as illustrated in FIG. 6, in case that the sensing electrode 540 is disposed, the output current of the pixel driving part PC applied to the inner conductive wall 390*a* and 390*b* and the separated cathode Cathodesl may cause noise to be applied to the sensing electrode 540. However, in FIG. 9, the transparent electrode PLEC may be below the sensing electrode (refer to 540 in FIG. 6), and may be disposed across the front of the inner conductive wall 390*a* and 390*b* and the separated cathode Cathodesl. Therefore, the sensing electrode (refer to 540 in FIG. 6) may be electrically separated and shielded from the inner conductive wall 390*a* and 390*b* and the separated cathode Cathodesl by the transparent electrode PLEC, thereby preventing noise from entering the sensing electrode (refer to 540 in FIG. 6).

Below, the embodiment of FIG. 10 will be described.

In the embodiment of FIG. 10, unlike the example of FIG. 5 in which the pixel defining layer 380 is formed of an inorganic insulating material, the pixel defining layer 380 may be formed of an organic insulating material.

The pixel defining layer 380 including an organic insulating material may be composed of a single layer, but in the embodiment of FIG. 10, the pixel defining layer 380 composed of a triple layer may be included.

The pixel defining layer 380 according to the embodiment of FIG. 10 may include a first pixel defining layer 380-*orb* (hereinafter also referred to as a black pixel defining layer), a second pixel defining layer 380-*pl* (hereinafter also referred to as a medium-angle pixel defining layer), and a third pixel defining layer 380-*ort* (hereinafter also referred to as a transparent pixel defining layer).

The first pixel defining layer 380-*orb* may be black to prevent light from being transmitted. According to the embodiment, the first pixel defining layer 380-*orb* may be formed of a negative-type black organic material. The black organic material may include a light blocking material, and the light blocking material may include carbon black, carbon nanotubes, a resin or paste including black dye, metal particles such as nickel, aluminum, molybdenum, and alloys thereof, metal oxide particles, and/or metal nitrides (e.g., chromium nitride). The first pixel defining layer 380-*orb* may include a light blocking material and may include a black color, and may have characteristics of absorbing/blocking light rather than reflecting the light. Because the negative type uses organic materials, the first pixel defining layer 380-*orb* may have the property of removing the part covered by the mask.

The second pixel defining layer 380-*pl* may be a temporary protective layer to protect the first pixel defining layer 380-*orb* during this process, and may be made of silicon oxide ($SiO_x$), silicon nitride ($SiN_x$), silicon oxynitride ($SiON_x$), etc. For example, the second pixel defining layer 380-*pl* may be an inorganic insulating layer. For example, according to the embodiment, the second pixel defining layer 380-*pl* may include an organic material. For example, the second pixel defining layer 380-*pl* may also function to improve contact characteristics between the first pixel defining layer 380-*orb* and the third pixel defining layer 380-*ort*.

The third pixel defining layer 380-*ort* may have the characteristic of allowing light to pass through, and according to an embodiment, the third pixel defining layer 380-*ort* may be formed of a positive-type photosensitive organic material. As an example, photosensitive polyimide (PSPI) may be used. As the third pixel defining layer 380-*ort* has positive characteristics, parts not covered by the mask may be removed. The third pixel defining layer 380-*ort* may be transparent so that light may be transmitted and/or reflected.

The third pixel defining layer 380-*ort* may function as a spacer, and may also function as a contact assistant between the first pixel defining layer 380-*orb* and the light emitting layer EMLr.

The second pixel defining layer 380-*pl* and the third pixel defining layer 380-*ort* may be formed to have a narrower width than the first pixel defining layer 380-*orb*. For example, in the embodiment of FIG. 10, the red opening OPr of the pixel defining layer 380 may be disposed in the first pixel defining layer 380-*orb*, and the second pixel defining layer 380-*pl* and the third pixel defining layer 380-*ort* may include openings that are wider than the red opening OPr.

According to the embodiment, the second pixel defining layer 380-*pl* may be omitted and the pixel defining layer 380 may be formed of only the first pixel defining layer 380-*orb* and the third pixel defining layer 380-*ort*.

The embodiment of FIG. 10 differs from the embodiment of FIG. 5 in that the pixel defining layer 380 is formed of an organic material, and all other features may be substantially the same.

Figure 11:
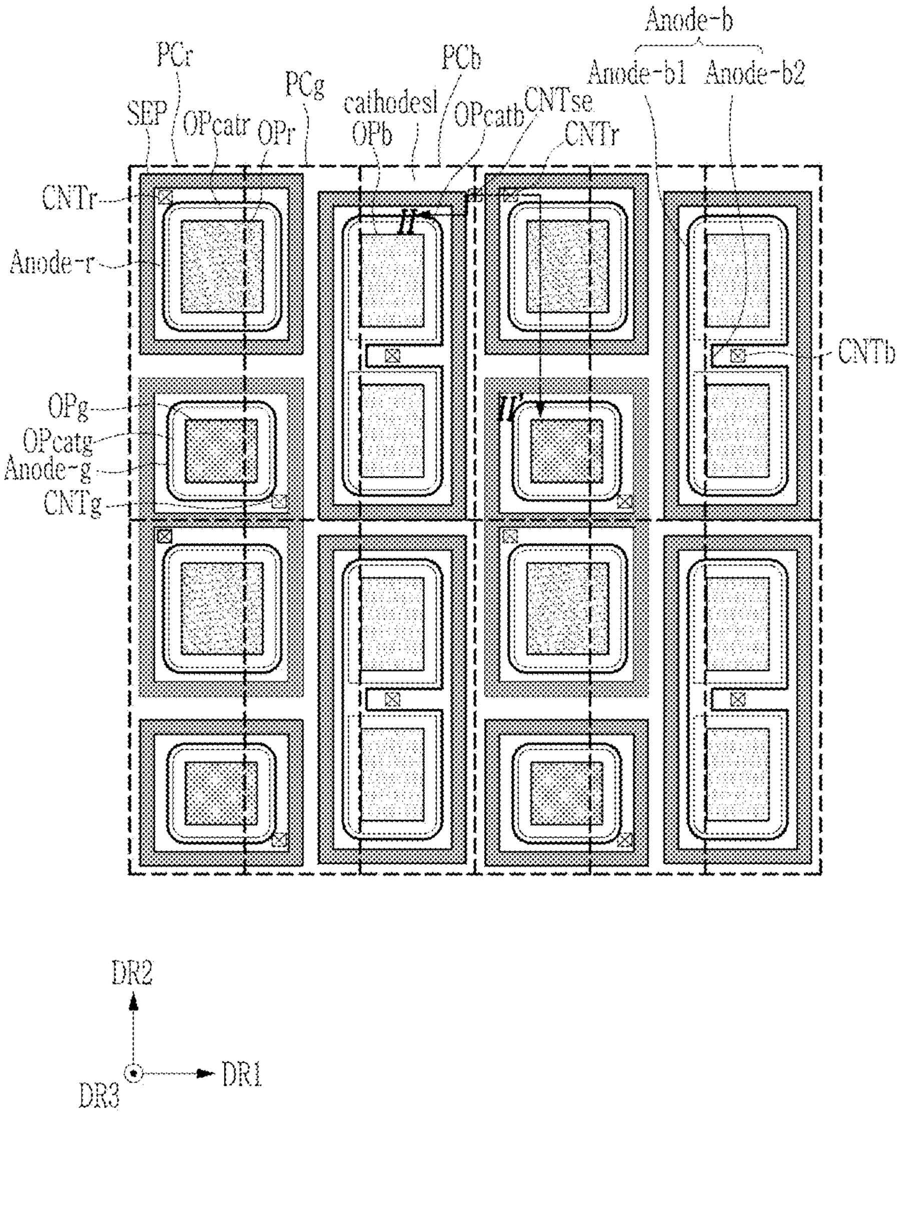
FIG. 11 is a schematic plan view showing the connection between a pixel driving part and a light emitting display device according to another embodiment.

Below, we will look at the embodiment of FIG. 11. FIG. 11 is a schematic plan view showing the connection between a pixel driving part and a light emitting display device according to another embodiment.

In FIG. 11, anodes Anode-r, Anode-g, and Anode-b according to an embodiment are additionally shown in a plan view of FIG. 4, and the planar structure of the anode Cathode may vary according to the embodiment.

Referring to the embodiment of FIG. 11, the boundaries of the red anode Anode-r of the red-light emitting diode, the green anode Anode-g of the green-light emitting diode, and the blue anode Anode-b of the blue-light emitting diode may be disposed between the separator SEP and the opening OPcatr, OPcatg, and OPcatb of the wall 390. As a result, each anode Anode-r, Anode-g, and Anode-b may overlap the openings OPcatr, OPcatg, and OPcatb of the wall 390 and the openings OPr, OPg, and OPb of the pixel defining layer 380 in plan. For example, the red anode Anode-r of the red-light emitting diode and the green anode Anode-g of the green-light emitting diode each may overlap the opening OPr and OPg of a pixel defining layer 380 in a plan view, but the blue anode Anode-b of the blue-light emitting diode may overlap the blue opening OPb of the two pixel defining layers 380. For example, the blue anode Anode-b of the blue light emitting diode may have a structure that does not overlap the contact hole CNTb disposed between the openings OPb of the two pixel defining layers 380. For example, the blue anode Anode-b of the blue light emitting diode may include an extension part Anode-b1 that overlaps the blue opening OPb of each pixel defining layer 380 in a plan view, and a connection part Anode-b2 connecting the extension part Anode-b1, and the connection part Anode-b2 may have a structure that does not overlap the contact hole CNTb in a plan view. The position and shape where the connection part Anode-b2 connects the two extension parts Anode-b1 may vary according to the embodiment.

Figure 12:
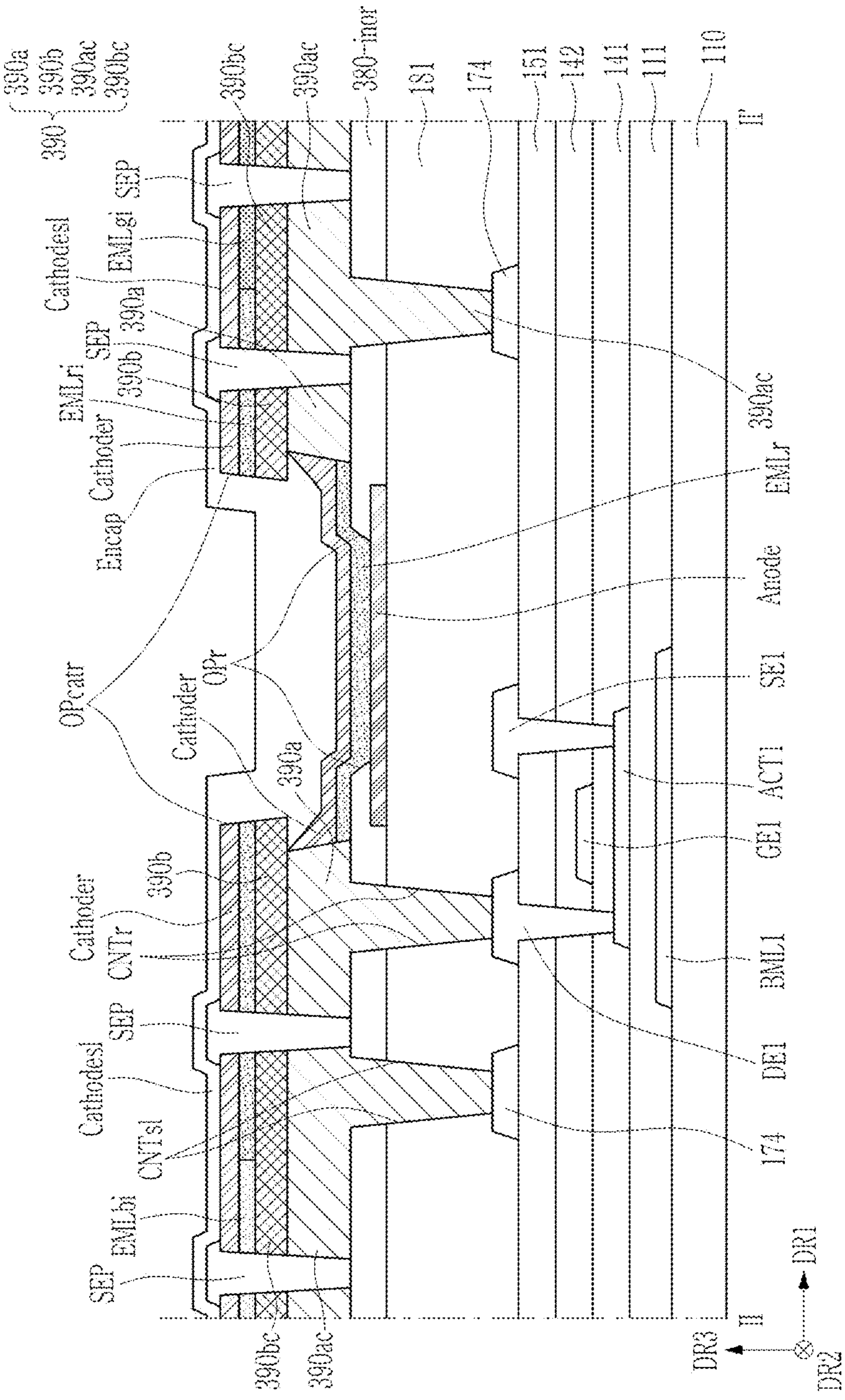
FIG. 12 is a schematic cross-sectional view taken along line II-II' of FIG. 11 illustrating a light emitting display device according to another embodiment.

Below, the embodiment of FIG. 12 will be described. FIG. 12 is a schematic cross-sectional view taken along line II-II' of FIG. 11 illustrating a light emitting display device according to another embodiment.

The embodiment of FIG. 12 is a modified example of FIG. 8 and shows a structure in which the separator SEP is not formed in (or does not pass through) the encapsulation layer Encap.

In the embodiment of FIG. 12, the separator SEP may be formed by passing through the separated cathodes Cathodesl, separated light emitting layers EMLri, EMLgi, and EMLbi, and walls 390, and may additionally be formed on a part of the pixel defining layer 380-*inor*. For example, the separator SEP may be filled with an insulating material. In another example, the separator SEP may be formed as an empty space.

In the embodiment of FIG. 12, an encapsulation layer Encap may be formed over a separator SEP, a separated cathode Cathodesl, and the cathode Cathoder.

Since a separator SEP is not formed in (or does not pass through) the encapsulation layer Encap, the effect of preventing moisture and air from entering the light emitting layer EML from the outside may be improved.

Hereinafter, through FIGS. 13 to 17, the structure of an electronic device in which the above light emitting display device may be used and the structure of other parts of the light emitting display device will be described, focusing on an embodiment.

Figure 13:
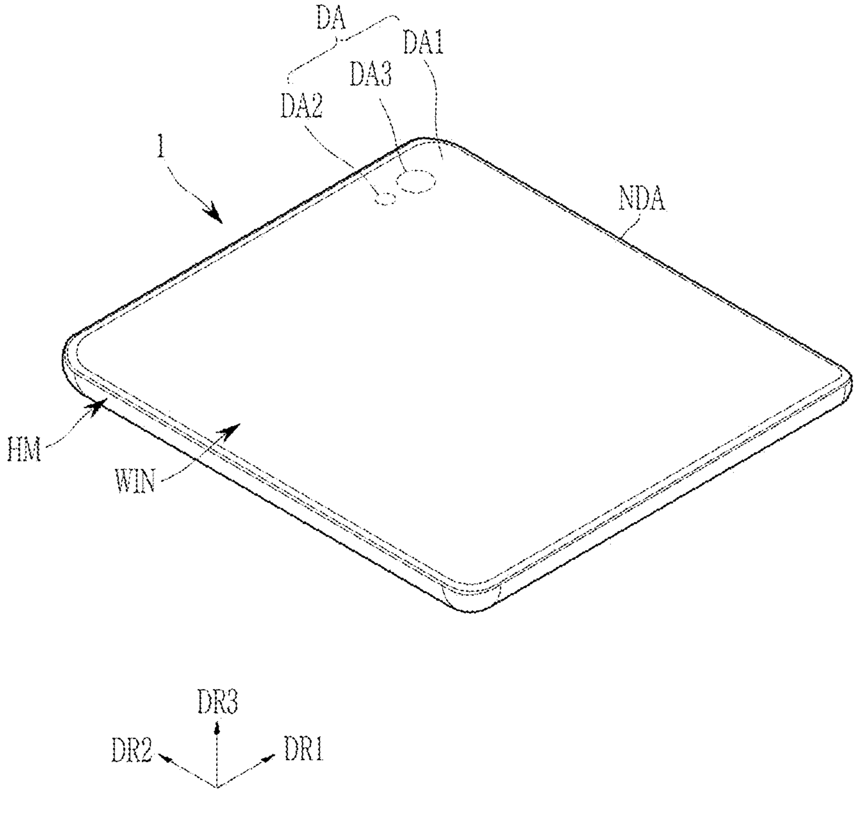
FIG. 13 is a schematic perspective view of an electronic device according to an embodiment.

FIG. 13 is a schematic perspective view of an electronic device according to an embodiment.

Referring to FIG. 13, the electronic device 1 may be an electronic device that provides a display screen capable of displaying moving images or still images in the third direction DR3. For example, the electronic device 1 may include a television, a laptop, etc. that provide display screens, monitors, billboards, Internet of Things, mobile phones, smart phones, tablet personal computers (PCs), electronic watches, smart watches, watch phones, head-mounted displays, mobile communication terminals, electronic notebooks, e-books, portable multimedia players (PMP), navigation systems, game consoles, digital cameras, camcorders, etc.

Figure 14:
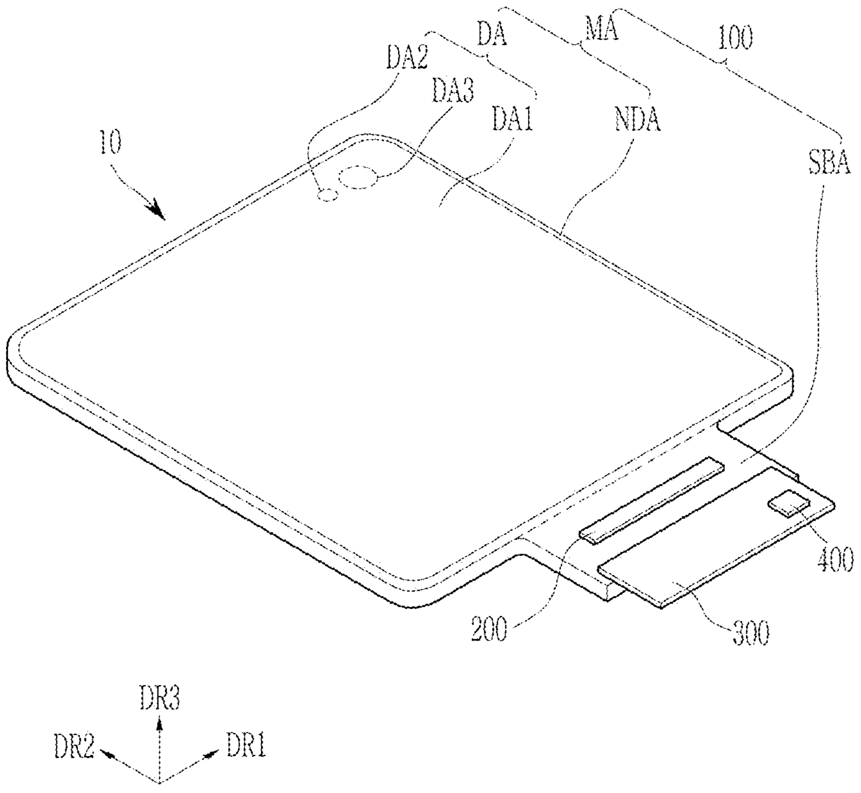
FIG. 14 is a schematic perspective view of a light emitting display device included in an electronic device according to an embodiment.

The electronic device 1 may include a cover window WIN and a housing HM, and the light emitting display device 10, which is disposed inside the cover window WIN and the housing HM as shown in FIG. 14. Therefore, the cover window WIN and the housing HM may be combined to form the exterior of the electronic device 1.

The cover window WIN may include an insulating panel. For example, the cover window WIN may be made of glass, plastic, or a combination thereof. According to the embodiment, the cover window WIN may include a touch-detection unit capable of detecting a touch.

The front of the cover window WIN may define the front of the electronic device 1.

The housing HM may be combined with the cover window WIN. The cover window WIN may be placed on the front of the housing HM.

The housing HM may be combined with the cover window WIN to provide an accommodation space. The light emitting display device 10 may be accommodated in the accommodation space provided between the housing HM and the cover window WIN.

The housing HM may include a material having relatively high rigidity. For example, the housing HM may include frames and/or plates made of glass, plastic, or metal, or a combination thereof. The housing HM may have a back and sides, a cover window WIN may be disposed on the upper part of the housing HM, and a light emitting display device 10 may be accommodated in the internal space formed by the housing HM and the cover window WIN. Thus, the components of the light emitting display device 10 may be reliably protected from external shock.

The electronic device 1 may include a light emitting display device (refer to 10 in FIG. 14) that provides a display screen in the third direction DR3. The display device included in the electronic device 1 may be a variety of display devices, such as an inorganic light emitting display device, an organic light emitting display device, and a quantum dot light emitting display device. Hereinafter, the description will focus on the case where a light emitting display device including an organic light emitting element is applied as an example of the display device, but embodiments are not limited thereto, and the same technical idea may be applied to other display devices.

The shape of the electronic device 1 may be modified in various ways. For example, the electronic device 1 may have a shape such as a long rectangle, a square, a square with rounded corners, a polygon, or a circle. The shape of the display area DA of the electronic device 1 may also be similar to the overall shape of the electronic device 1. In FIG. 13, the electronic device 1 is shown in a rectangular shape having a relatively long length in the first direction DR1, but embodiments are not limited thereto.

The electronic device 1 may include a display area DA and a non-display area NDA. The display area DA and non-display area NDA shown in FIG. 13 may correspond to the display area DA and non-display area NDA of the light emitting display device 10. The display area DA may be an area where the screen is displayed, and the non-display area NDA may be an area where the screen is not displayed. The display area DA may occupy most of the area centered around the center portion of the electronic device 1, and the non-display area NDA may have a structure surrounding the periphery of the display area DA.

The display area DA may include a first display area DA1, a second display area DA2, and a third display area DA3. The second display area DA2 and the third display area DA3 may be areas where components such as sensors or cameras, which are added to provide various functions to the electronic device 1, may be disposed on the surface (e.g., the surface disposed at the bottom thereof in the third direction DR3), and the second display area DA2 and the third display area DA3 may correspond to (or overlap) the component areas.

The second display area DA2 and the third display area DA3 may be surrounded by the first display area DA1. In addition to the first display area DA1, the second display area DA2 and the third display area DA3 may display images. The positions and numbers of the second display area DA2 and the third display area DA3 may vary according to the embodiment.

Hereinafter, the structure of a light emitting display device, which is an example of a display device, will be described referring to FIG. 14.

FIG. 14 is a schematic perspective view of a light emitting display device included in an electronic device according to an embodiment.

Referring to FIG. 14, an electronic device 1 according to an embodiment may include a light emitting display device 10. The light emitting display device 10 may display a screen on the electronic device 1 and may detect or take pictures of the front of the electronic device 1. The light emitting display device 10 may have a planar shape similar to that of the electronic device 1. For example, the light emitting display device 10 may have a shape similar to a rectangle having sides in the first direction DR1 and sides in the second direction DR2. The edge portion where the side in the first direction DR1 meets the side in the second direction DR2 may be rounded to have a certain curvature, but embodiments are not limited to this and may also be formed at a right angle. The planar shape of the light emitting display device 10 is not limited to a square shape, and may be similar to other polygonal, circular, or oval shapes.

The light emitting display device 10 may include a display panel 100, a display driver 200, a circuit board 300, and a touch driver 400.

The display panel 100 may include a main area MA and a sub-area SBA.

The main area MA may include a display area DA including pixels that display an image and a non-display area NDA disposed around the display area DA. The display area DA may include a first display area DA1, a second display area DA2, and a third display area DA3. The second display area DA2 and the third display area DA3 not only include pixels, but also components such as sensors or cameras may be disposed below in the third direction DR3, and the second display area DA2 and the third display area DA3 may correspond to (or overlap) a component area.

The display area DA may emit light in the third direction DR3 from light emitting areas corresponding to light emitting diodes. For example, the display panel 100 may include a pixel circuit portion including a transistor, and a pixel defining layer 380 including a light emitting diode LED and having an opening defining a light emitting area of the light emitting diode. For example, the light emitting diode LED may include an organic light emitting diode including an organic light emitting layer, a quantum dot light emitting diode including a quantum dot light emitting layer (e.g., quantum dot LED), an inorganic light emitting diode including an inorganic semiconductor (e.g., inorganic LED), and a micro light emitting diode, the light emitting diode LED may include at least one device (e.g., micro LED), but embodiments are not limited thereto.

The non-display area NDA may be an area outside the display area DA and surrounds the display area DA. The non-display area NDA may be defined as an edge area of the main area MA of the display panel 100. The non-display area NDA may include a gate driver (e.g., 210 in FIG. 15) that supplies gate signals to the gate lines, and fan-out lines connecting the display driver 200 and the display area DA.

The sub-area SBA may be an area extending from a side of the main area MA. The sub-area SBA may include a flexible material capable of bending, folding, rolling, etc. For example, in case that the sub-area SBA is bent, the sub-area SBA may overlap the main area MA in the thickness direction (e.g., third direction DR3). The sub-area SBA may include a display driver 200 and a pad portion connected to the circuit board 300. In another embodiment, the sub-area SBA may be omitted, and the display driver 200 and the pad unit may be placed in the non-display area NDA.

The display driver 200 may output signals and voltages for driving the display panel 100. The display driver 200 may supply data voltages to data lines. The display driver 200 may supply a power voltage to a power line and a gate-control signal to the gate driver 210. The display driver 200 may be formed of an integrated circuit (IC) and mounted on the display panel 100 using a chip-on-glass (COG) method, a chip-on-plastic (COP) method, or an ultrasonic bonding method. For example, the display driver 200 may be disposed in the sub-area SBA and may overlap the main area MA in the thickness direction (e.g., third direction DR3) by bending the sub-area SBA. For another example, the display driver 200 may be mounted on the circuit board 300.

The circuit board 300 may be attached to the pad portion of the display panel 100 using an anisotropic conductive film (ACF). The lead lines of the circuit board 300 may be electrically connected to the pad portion of the display panel 100. The circuit board 300 may be a flexible printed circuit board, a printed circuit board, or a flexible film such as a chip on film.

The touch driver 400 may be mounted on the circuit board 300. The touch driver 400 may be electrically connected to a touch sensor included in the electronic device 1. The touch driver 400 may supply a touch driving signal to sensing electrodes (refer to 540 in FIG. 6) of the touch driver 400 and sense a change in capacitance between the sensing electrodes (refer to 540 in FIG. 6). For example, the touch driving signal may be a pulse signal with a selected frequency. The touch driver 400 may determine whether there is input and calculate input coordinates based on the amount of change in capacitance between the sensing electrodes (refer to 540 in FIG. 6). The touch driver 400 may be formed as an integrated circuit IC.

Hereinafter, the cross-sectional structure of the light emitting display device 10 will be described referring to FIG. 15.

Figure 15:
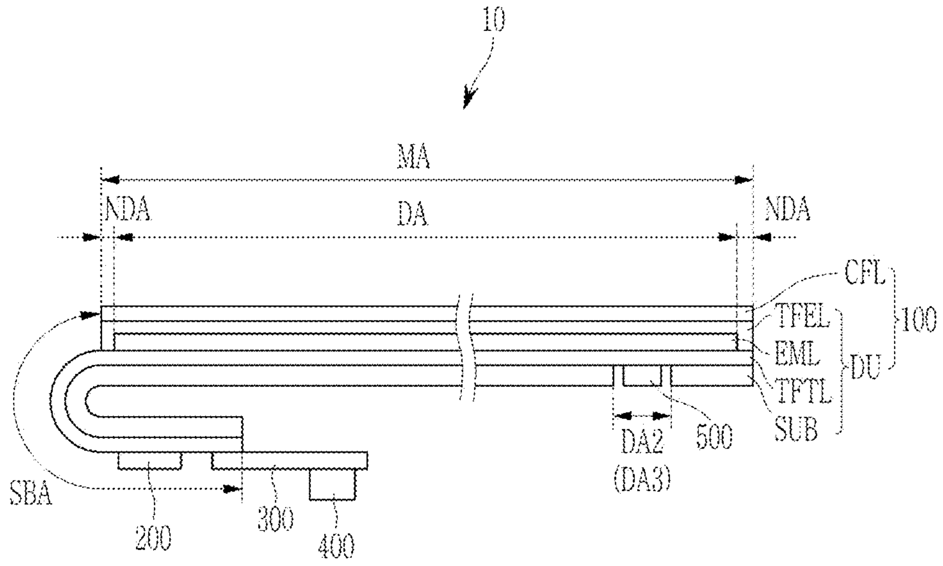
FIG. 15 is a schematic cross-sectional view of the light emitting display device of FIG. 14.

FIG. 15 is a schematic cross-sectional view of the light emitting display device of FIG. 14.

Referring to FIG. 15, the display panel 100 may include a display layer DU and an external light reduction layer CFL.

The display layer DU may include a substrate SUB, a driving part layer TFTL, a light emitting layer EML, and a cover encapsulation layer TFEL. The substrate SUB may be a base substrate or a base member. The substrate SUB may be a flexible substrate capable of bending, folding, rolling, etc. For example, the substrate SUB may include a polymer resin such as polyimide (PI), but embodiments are not limited thereto. In another embodiment, the substrate SUB may include a glass material or a metal material.

The driving part layer TFTL may be disposed on the substrate SUB. The driving part layer TFTL may include transistors and capacitors forming a pixel circuit unit that outputs and transmits current to the light emitting element. The driving part layer TFTL may include gate lines, data lines, power lines, gate-control lines, fan-out lines connecting the display driver 200 and the data lines, and lead lines connecting the display driver 200 and the pad portion. Each transistor may include a semiconductor including a channel region, a source region, and a drain region, and a gate electrode disposed on a side of the semiconductor. For example, the source region and drain region of the semiconductor may function as the source electrode (e.g., first electrode) and drain electrode (e.g., second electrode) of the transistor, respectively. For example, in case that the gate driver 210 is formed on a side of the non-display area NDA of the display panel 100, the gate driver 210 may include transistors.

The driving part layer TFTL may be disposed in the display area DA, the non-display area NDA, and the sub-area SBA. Transistors, gate lines, data lines, and power lines of the driving part layer TFTL may be disposed in the display area DA. Gate-control lines and fan-out lines of the driving part layer TFTL may be disposed in the non-display area NDA. Lead lines of the driving part layer TFTL may be disposed in the sub-area SBA.

The light emitting layer EML may include a light emitting diode LED and a corresponding light emitting region, and may be disposed on the driving part layer TFTL. The light emitting layer EML may include light emitting diodes that emit light, including a first electrode, a second electrode, and a light emitting layer, and a pixel defining layer 380 having an opening that defines a light emitting area. The light emitting layer EML of the emitting diodes of may be disposed in the display area DA. In an embodiment, the light emitting layer EML may be an organic light emitting layer including an organic material. A functional layer including at least one of an electron injection layer, an electron transport layer, a hole transport layer, and a hole injection layer may be disposed on sides (e.g., opposite sides) of the light emitting layer EML. For example, the combination of the light emitting layer EML and the functional layer may be referred to as an intermediate layer. In case that the first electrode receives a voltage through the transistor of the driving part layer TFTL and the second electrode receives a driving low voltage, holes and electrons are transmitted through the hole transport layer, the electron transport layer, respectively, the holes and the electrons may be moved to the light emitting layer EML and may combine with each other in the organic light emitting layer to emit light. For example, one of the first electrode and the second electrode may be an anode, and the other may be a cathode.

In another embodiment, the light emitting diode LED may be a quantum dot light emitting diode including a quantum dot light emitting layer, an inorganic light emitting diode including an inorganic semiconductor, or a micro light emitting diode.

The cover encapsulation layer TFEL may cover the top and side surfaces of the light emitting layer EML and may prevent external moisture and air from entering the light emitting layer EML. The cover encapsulation layer TFEL may include at least one inorganic layer and at least one organic layer to encapsulate the light emitting layer EML.

The external light reduction layer CFL may be disposed on the cover encapsulation layer TFEL. The external light reduction layer CFL may include color filters corresponding to each of the light emitting areas. For example, a light blocking layer may be disposed between color filters adjacent to the external light reduction layer CFL or in an overlapping portion where adjacent color filters overlap. The light blocking layer may be disposed above or below the color filter in the third direction DR3, or may be disposed on sides (e.g., opposite sides).

Since the external light reduction layer CFL is disposed (e.g., directly disposed) on the cover encapsulation layer TFEL, the light emitting display device 10 may not require a separate substrate for the external light reduction layer CFL. For example, a polarizer may not be attached to the top (or upper surface) of the external light reduction layer CFL. As a result, the thickness of the light emitting display device 10 may be relatively small. For example, since the light emitting display device 10 does not include a polarizer, there may be a disadvantage in that external light is directly reflected, but the reflection of external light may be reduced by the color filter or light blocking layer included in the external light reduction layer CFL. For example, the color filters may selectively transmit light of a specific wavelength and block or absorb light of other wavelengths, and the light blocking layer may absorb external light, so the amount of external light flowing into the light emitting display device 10 may vary, and the amount of reflected light may be also reduced, thereby reducing disadvantages caused by reflection of external light.

According to the embodiment, the light emitting display device 10 may further include an optical device 500. The optical device 500 may be disposed on the back of the second display area DA2 or the third display area DA3. The optical device 500 may emit or receive light in the infrared, ultraviolet, and visible light bands. For example, the optical device 500 may be an optical sensor that detects light incident on the light emitting display device 10, such as a proximity sensor, an illumination sensor, a camera sensor, or an image sensor.

Hereinafter, the connection relationship of the components included in the light emitting display device 10 will be described in detail referring to FIG. 16.

Figure 16:
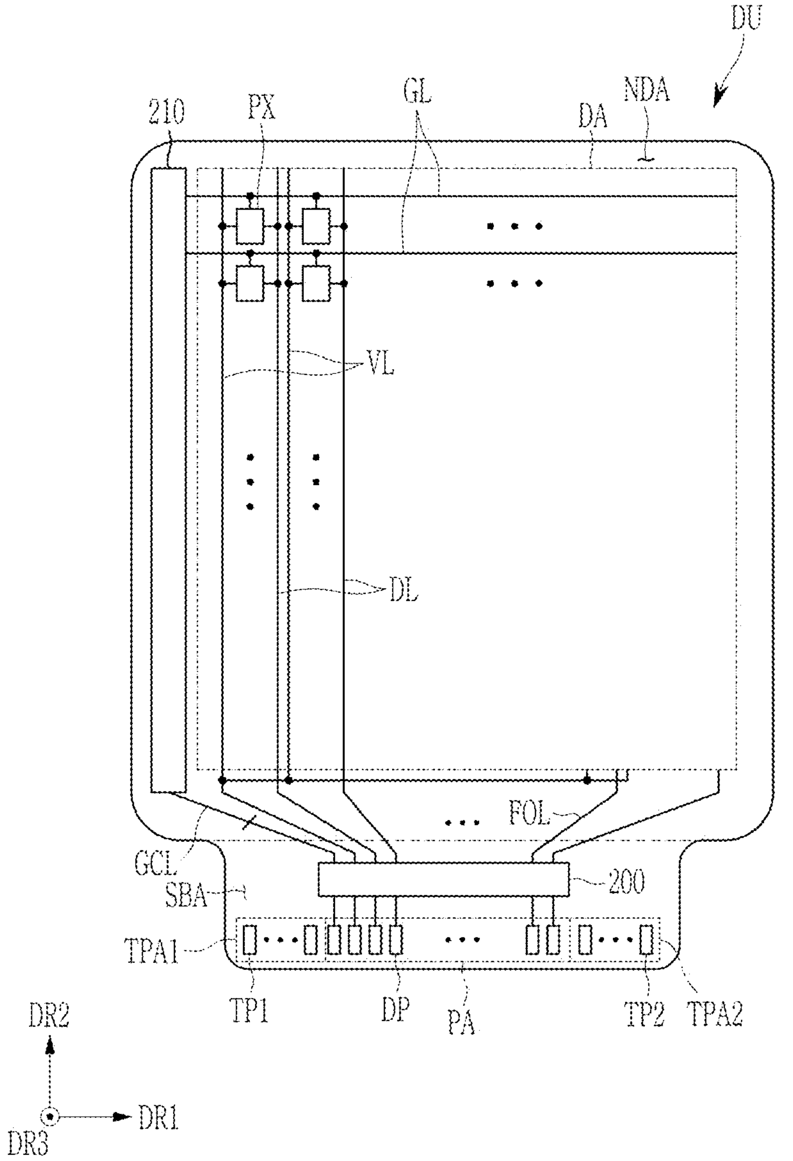
FIG. 16 is a schematic plan view showing the connection relationship between components of a light emitting display device according to an embodiment.

FIG. 16 is a schematic plan view showing the connection relationship between components of a light emitting display device according to an embodiment.

Referring to FIG. 16, the display layer DU of the light emitting display device 10 may include a display area DA and a non-display area NDA.

The display area DA may be disposed at the center portion of the display panel 100. unit pixels PX, gate lines GL, data lines DL, and power lines VL may be arranged in the display area DA. Each of the unit pixels PX may be a minimum unit that emits light and may include a pixel circuit unit including a transistor and a capacitor, and a light emitting element that receives current from the pixel circuit unit.

Each unit pixel PX may be connected to a gate line GL, a data line DL, and a power line VL, and the gate line GL and power line VL each may include a plurality of lines.

The gate lines GL may supply gate signals received from the gate driver 210 to the unit pixels PX. The gate lines GL may extend in the first direction DR1 and may be spaced apart from each other in the second direction DR2 that intersects the first direction DR1.

The data lines DL may supply data voltages received from the display driver 200 to the unit pixels PX. The data lines DL may extend in the second direction DR2 and may be spaced apart from each other in the first direction DR1.

The power lines VL may supply the power voltage received from the display driver 200 to the unit pixels PX. For example, the power voltage may be at least one of a driving voltage, an initialization voltage, a reference voltage, and a driving low voltage, and these power voltages may be transmitted to the unit pixel PX. The power lines VL may extend in the second direction DR2 and may be spaced apart from each other in the first direction DR1.

The non-display area NDA may surround the display area DA. A gate driver 210, fan-out lines FOL, and gate-control lines GCL may be disposed in the non-display area NDA.

The gate driver 210 may generate gate signals based on the gate-control signal and sequentially supply the gate signals to the gate lines GL in a certain order.

The fan-out lines FOL may extend from the display driver 200 to the display area DA. The fan-out lines FOL may supply the data voltage received from the display driver 200 to the data lines DL.

The gate-control lines GCL may extend from the display driver 200 to the gate driver 210. The gate-control line GCL may supply the gate-control signal received from the display driver 200 to the gate driver 210.

Referring to FIG. 16, the light emitting display device 10 may further include a sub-area SBA.

The sub-area SBA may include the display driver 200, the pad area PA, and the first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to unit pixels PX, and the luminance of the unit pixels PX may be controlled. The display driver 200 may supply a gate-control signal to the gate driver 210 through the gate-control line GCL.

The pad area PA, the first touch pad area TPA1, and the second touch pad area TPA2 may be disposed at the edge portion of the sub-area SBA. The pad area PA may include display pad portions DP. The display pad portions DP may be connected to a graphics system through the circuit board 300. The display pad portions DP may be connected to the circuit board 300 to receive digital video data, and may supply digital video data to the display driver 200. The first touch pad area TPA1 and the second touch pad area TPA2 each may include multiple touch pads TP1 and TP2, and may be connected to the touch driver 400 disposed on the circuit board 300, enabling them to detect touch. The pad area PA, the first touch pad area TPA1, and the second touch pad area TPA2 may be electrically connected to the circuit board 300 using a material such as an anisotropic conductive film or self-assembly anisotropic conductive paste (SAP).

Hereinafter, an embodiment of one of the electronic devices including the light emitting display device according to this embodiment will be described with reference to FIG. 17.

Figure 17:
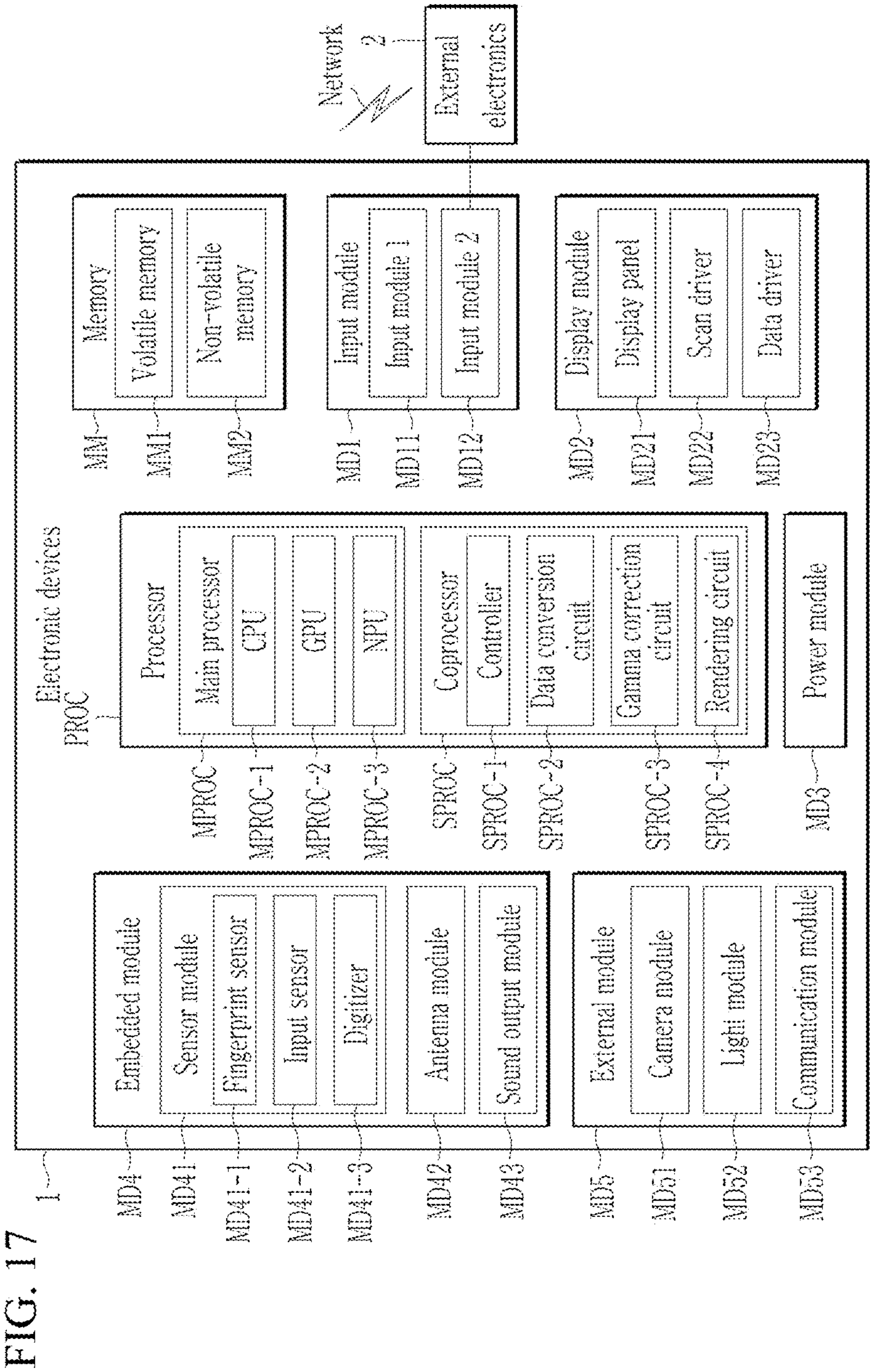
FIG. 17 is a block diagram of an electronic device according to an embodiment.

FIG. 17 is a block diagram of an electronic device according to an embodiment.

The electronic device 1 may output various information through the display module MD2 using the operating system. In case that the processor PROC executes the application stored in the memory MM, the display module MD2 may provide application information to the user through the display panel MD21. For example, the display panel MD21 may be the light emitting display device described above.

The processor PROC may obtain external input through the input module MD1 or the sensor module MD41 and may execute the application corresponding to the external input. For example, in case that the user selects the camera icon displayed on the display panel MD21, the processor PROC may obtain the user input through the input sensor MD41-2 and may active the camera module MD51. The processor PROC may transmit image data corresponding to the captured image acquired through the camera module MD51 to the display module MD2. The display module MD2 may display an image corresponding to the captured image through the display panel MD21.

As another example, in case that personal information authentication is performed in the display module MD2, the fingerprint sensor MD41-1 may obtain the input fingerprint information as input data. The processor PROC compares the input data obtained through the fingerprint sensor MD41-1 with the authentication data stored in the memory MM and executes the application according to the comparison result. The display module MD2 may display information executed according to the logic of the application through the display panel MD21. As another example, in case that the music streaming icon displayed on the display module MD2 is selected, the processor PROC may obtain user input through the input sensor MD41-2 and may activate the music streaming application stored in the memory MM. In case that a music play command is input in the music streaming application, the processor PROC may activate the sound output module MD43 to provide the user with sound information that matches the music play command.

In the above, the operation of the electronic device 1 has been briefly described. Below, the configuration of the electronic device 1 will be described in detail. Some of the components of the electronic device 1 described later may be integrated and provided as a single component, or a single component may be provided separately in two or more components.

Referring to FIG. 17, the electronic device 1 may communicate with an external electronic device 2 through a network (e.g., a short-range wireless communication network or a long-range wireless communication network). According to an embodiment, the electronic device 1 may include a processor PROC, a memory MM, an input module MD1, a display module MD2, a power module MD3, an embedded module MD4, and an external module MD5. According to an embodiment, in the electronic device 1, at least one of the above-described components may be omitted, or one or more other components may be added. According to an embodiment, some of the above-described components (e.g., sensor module MD41, antenna module MD42, or sound output module MD43) may be connected to another component (e.g., display module MD2).

The processor PROC may execute software to control at least one other component (e.g., hardware or software component) of the electronic device 1 connected to the processor PROC and perform various data processing or calculations. According to an embodiment, as part of data processing or operation, the processor PROC may store commands or data received from other components (e.g., input module MD1, sensor module MD41, or communication module MD53) in a volatile memory MM1, processes the commands or data stored in the volatile memory MM1, and the resulting data may be stored in a non-volatile memory MM2.

The processor PROC may include a main processor MPROC and an auxiliary processor SPROC. The main processor MPROC may include one or more of a central processing unit MPROC-1, a central processing unit (CPU) or an application processor (AP). The main processor MPROC may further include one or more of a graphics processing unit MPROC-2, a graphics processing unit (GPU), a communication processor (CP), and an image signal processor (ISP). The main processor MPROC may further include a neural processing unit MPROC-3, a neural processing unit (NPU). A neural network processing unit may be a processor specialized in processing artificial intelligence models, and artificial intelligence models may be created through machine learning. An artificial intelligence model may include multiple artificial neural network layers. Artificial neural networks may include a deep neural network (DNN), a convolutional neural network (CNN), a recurrent neural network (RNN), a restricted boltzmann machine (RBM), a deep belief network (DBN), a bidirectional recurrent deep neural network (BRDNN), and it may be one of deep Q-networks or a combination of two or more of the above, but embodiments are not limited to the examples described above. In addition to hardware structures, artificial intelligence models may additionally or alternatively include software structures. At least two of the above-described processing unit and processor may be implemented as an integrated configuration (e.g., a single chip), or each may be implemented as an independent configuration (e.g., chips).

The auxiliary processor SPROC may include a controller SPROC-1. The controller SPROC-1 may include an interface conversion circuit and a timing control circuit. The controller SPROC-1 may receive a video signal from the main processor MPROC, may convert the data format of the video signal to match the interface specifications with the display module MD2, and may output video data. The controller SPROC-1 may output various control signals necessary for driving the display module MD2. The auxiliary processor SPROC may further include a data conversion circuit SPROC-2, a gamma correction circuit SPROC-3, and a rendering circuit SPROC-4. The data conversion circuit SPROC-2 may receive image data from the controller SPROC-1 and may compensate the image data so that the image may be displayed at the selected brightness according to the characteristics of the electronic device 1 or the user's settings, or power consumption, image data may be converted to reduce or compensate for afterimages. A gamma correction circuit SPROC-3 may convert image data or a gamma reference voltage so that an image displayed on the electronic device 1 may have desired gamma characteristics. The rendering circuit SPROC-4 may receive image data from the controller SPROC-1 and render the image data considering the pixel arrangement of the display panel MD21 applied to the electronic device 1. At least one of the data conversion circuit SPROC-2, the gamma correction circuit SPROC-3, and the rendering circuit SPROC-4 may be integrated into another component (e.g., the main processor MPROC or the controller SPROC-1). At least one of the data conversion circuit SPROC-2, the gamma correction circuit SPROC-3, and the rendering circuit SPROC-4 may be integrated into a data driver MD23 to be described later.

The memory MM may store various data used by at least one component of the electronic device 1 (e.g., a processor PROC or a sensor module MD41) and input data or output data for instructions related thereto. The memory MM may include at least one of a volatile memory MM1 and a non-volatile memory MM2.

The input module MD1 may receive commands or data to be used in a component of the electronic device 1 (e.g., a processor PROC, a sensor module MD41, or an audio output module MD43) from the outside of the electronic device 1 (e.g., may be received from the user or an external electronic device 2).

The input module MD1 may include a first input module MD11 through which a command or data is input from the user, and a second input module MD12 through which a command or data is input from the external electronic device 2. The first input module MD11 may include a microphone, mouse, keyboard, keys (e.g., buttons), or pen (e.g., passive pen or active pen). The second input module MD12 may support a designated protocol that connects to the external electronic device 2 by wire or wirelessly. According to an embodiment, the second input module MD12 may include a high-definition multimedia interface (HDMI), a universal serial bus (USB) interface, a secure digital (SD) card interface, or an audio interface. The second input module MD12 may include a connector that is physically connected to the external electronic device 2, such as an HDMI connector, a USB connector, an SD card connector, or an audio connector (e.g., a headphone connector).

The display module MD2 may provide information visually to the user. The display module MD2 may include a display panel MD21, a scan driver MD22, and a data driver MD23.

The display module MD2 may further include a window, a chassis, and a bracket to protect the display panel MD21.

The display panel MD21 may include a liquid crystal display panel, an organic light emitting display panel, or an inorganic light emitting display panel, and the type of the display panel MD21 is not limited. The display panel MD21 may be a rigid type or a flexible type capable of rolling or folding. The display module MD2 may further include a supporter, a bracket, or a heat-dissipation member that supports the display panel MD21.

The scan driver MD22 may be mounted on the display panel MD21 as a driving chip. For example, the scan driver MD22 may be integrated into the display panel MD21. For example, the scan driver MD22 may include an amorphous silicon thin-film-transistor (TFT) gate driver circuit (ASG), a low-temperature polycrystalline silicon (LTPS), a TFT gate driver circuit, or an oxide semiconductor TFT gate driver circuit (OSG) embedded in the display panel MD21. The scan driver MD22 may receive a control signal from the controller SPROC-1 and may output scan signals to the display panel MD21 in response to the control signal.

The display panel MD21 may further include a light emitting driver. The light emitting driver may output a light emission control signal to the display panel MD21 in response to the control signal received from the controller SPROC-1. The light emitting driver may be formed separately from the scan driver MD22 or may be integrated into the scan driver MD22.

The data driver MD23 may receive a control signal from the controller SPROC-1, may convert image data into analog voltage (e.g., data voltage) in response to the control signal, and then may output the data voltage to the display panel MD21.

The data driver MD23 may be integrated into other components (e.g., controller SPROC-1). The functions of the interface conversion circuit and timing control circuit of the above-described controller SPROC-1 may be integrated into the data driver MD23.

The display module MD2 may further include a light emitting driver and a voltage generation circuit. The voltage generation circuit may output various voltages required to drive the display panel MD21.

The power module MD3 may supply power to the components of the electronic device 1. The power module MD3 may include a battery that charges the power voltage. The battery may include a non-rechargeable primary cell, a rechargeable secondary cell, or a fuel cell. The power module MD3 may include a power management integrated circuit (PMIC). The PMIC may supply optimized power to each of the above-described modules and the modules described below. The power module MD3 may include a wireless power transmission/reception member electrically connected to a battery.

The wireless power transmission/reception member may include coil-shaped antenna radiators.

The electronic device 1 may further include an embedded module MD4 and an external module MD5. The embedded module MD4 may include a sensor module MD41, an antenna module MD42, and an audio output module MD43. The external module MD5 may include a camera module MD51, a light module MD52, and a communication module MD53.

The sensor module MD41 may detect an input from the user's body or an input from a pen among the first input module MD11, and generate an electrical signal or data value corresponding to the input. The sensor module MD41 may include at least one of a fingerprint sensor MD41-1, an input sensor MD41-2, and a digitizer MD41-3.

The fingerprint sensor MD41-1 may generate data values corresponding to the user's fingerprint. The fingerprint sensor MD41-1 may include an optical fingerprint sensor and a capacitive fingerprint sensor.

The input sensor MD41-2 may generate data values corresponding to coordinate information of input by the user's body or pen. The input sensor MD41-2 may generate the amount of change in capacitance caused by the input as a data value. The input sensor MD41-2 may detect input by a passive pen or transmit and receive data with an active pen.

The input sensor MD41-2 may also measure vital signs such as blood pressure, moisture, or body fat. For example, in case that a user touches a part of the body to the sensor layer or sensing panel and does not move during a certain period of time, the input sensor MD41-2 may detect the biological signal based on the change in the electric field caused by the part of the body. Thus, the information desired by the user may be output to the display module MD2.

The digitizer MD41-3 may generate data values corresponding to coordinate information input by the pen. The digitizer MD41-3 may generate the electromagnetic change due to input as a data value. The digitizer MD41-3 may detect input from a passive pen or transmit and receive data with an active pen.

At least one of the fingerprint sensor MD41-1, the input sensor MD41-2, and the digitizer MD41-3 may be implemented as a sensor layer formed on the display panel MD21 by a continuous process. The fingerprint sensor MD41-1, the input sensor MD41-2, and the digitizer MD41-3 may be disposed on the upper side of the display panel MD21, the fingerprint sensor MD41-1, the input sensor MD41-2, and the digitizer MD41-3. For example, the digitizer MD41-3 may be disposed below the display panel MD21.

At least two of the fingerprint sensor MD41-1, the input sensor MD41-2, and the digitizer MD41-3 may be formed to be integrated into one sensing panel by the same process. In case that integrated into a single sensing panel, the sensing panel may be placed between the display panel MD21 and a window disposed above the display panel MD21. According to an embodiment, the sensing panel may be placed on a window, and the location of the sensing panel is not limited.

At least one of the fingerprint sensor MD41-1, the input sensor MD41-2, and the digitizer MD41-3 may be embedded into the display panel MD21. For example, through the process of forming elements (e.g., light-emitting elements, transistors) included in the display panel MD21, the fingerprint sensor MD41-1, the input sensor MD41-2, and the digitizer MD41-3, at least one of them may be formed simultaneously.

For example, the sensor module MD41 may generate an electrical signal or data value corresponding to the internal state or external state of the electronic device 1. The sensor module MD41 may include a gesture sensor, gyro sensor, pressure sensor, magnetic sensor, acceleration sensor, grip sensor, proximity sensor, color sensor, infrared (IR) sensor, biometric sensor, temperature sensor, humidity sensor, or illuminance sensor.

The antenna module MD42 may include one or more antennas for transmitting or receiving signals or power from the outside. According to an embodiment, the communication module MD53 may transmit a signal to or receive a signal from an external electronic device through an antenna suitable for a communication method. The antenna pattern of the antenna module MD42 may be integrated into a single component of the display module MD2 (e.g., the display panel MD21) or the input sensor MD41-2.

The sound output module MD43 may be a device for outputting sound signals to the outside of the electronic device 1. For example, it may include a speaker used for general purposes such as multimedia playback or recording playback, and a receiver used exclusively for receiving calls. According to an embodiment, the receiver may be formed integrally with the speaker or separately. The sound output pattern of the sound output module MD43 may be integrated into the display module MD2.

The camera module MD51 may shoot still images and videos. According to an embodiment, the camera module MD51 may include one or more lenses, an image sensor, or an image signal processor. The camera module MD51 may further include an infrared camera capable of measuring the presence or absence of the user, the user's location, and the user's gaze.

The light module MD52 may provide light. The light module MD52 may include a light emitting diode LED or a xenon lamp. The light module MD52 may operate in conjunction with the camera module MD51 or independently.

The communication module MD53 may support or provide a wired or wireless communication channel between the electronic device 1 and the external electronic device 2, and performance of communication through the established communication channel. The communication module MD53 may include any or all of a wireless communication module such as a cellular communication module, a short-range wireless communication module, or a global navigation satellite system (GNSS) communication module, and a wired communication module such as a local area network (LAN) communication module or a power line communication module. The communication module MD53 may connect the external electronic device 2 via a short-range communication network such as Bluetooth, WiFi direct, or infrared data association (IrDA) or a long-distance communication network such as a cellular network, the Internet, or a computer network (e.g., LAN or WAN). The various types of communication modules MD53 described above may be implemented on a single chip or may be implemented on separate chips.

The input module MD1, sensor module MD41, camera module MD51, etc. may be used to control the operation of the display module MD2 in conjunction with the processor PROC.

The processor PROC may output commands or data to the display module MD2, audio output module MD43, camera module MD51, or light module MD52 based on the input data received from the input module MD1. For example, the processor PROC may generate image data in response to input data applied through a mouse or active pen and may output the image data to the display module MD2, or may generate command data in response to the input data to the camera module MD51. In another example, it may be output to the light module MD52. In case that the processor PROC does not receive input data from the input module MD1 for a certain period of time, the processor PROC may switch the operation mode of the electronic device 1 to low-power mode or sleep mode to reduce the power consumed by the electronic device 1.

The processor PROC may output commands or data to the display module MD2, audio output module MD43, camera module MD51, or light module MD52 based on the sensing data received from the sensor module MD41. For example, the processor PROC may compare the authentication data authorized by the fingerprint sensor MD41-1 with the authentication data stored in the memory MM and then execute the application according to the comparison result. The processor PROC may execute a command or output corresponding image data to the display module MD2 based on sensing data detected by the input sensor MD41-2 or the digitizer MD41-3. In case that the sensor module MD41 may include a temperature sensor, the processor PROC may receive temperature data for the temperature measured from the sensor module MD41 and further performs luminance correction, etc. on the image data based on the temperature data.

The processor PROC may receive measurement data about the presence or absence of the user, the user's location, the user's gaze, etc. from the camera module MD51. The processor PROC may further perform luminance correction, etc. on the image data based on the measurement data. For example, the processor PROC, which determines the presence or absence of a user through input from the camera module MD51, may output luminance-corrected image data to the display module MD2 through the data conversion circuit SPROC-2 or the gamma correction circuit SPROC-3.

Some of the above components may use a communication method between peripheral devices, such as a bus, general purpose input/output (GPIO), serial peripheral interface (SPI), mobile industry processor interface (MIPI), or ultra path interconnect (UPI), and they may be connected to each other through a link and may exchange signals (e.g., commands or data) with each other. The processor PROC may communicate with the display module MD2 through a mutually agreed-upon interface. For example, any one of the above-described communication methods may be used, and embodiments are not limited to the above-described communication method.

Electronic devices 1 according to various embodiments disclosed in this document may be devices of various types. The electronic device 1 may include, for example, at least one of a portable communication device (e.g., a smart phone), a computer device, a portable multimedia device, a portable medical device, a camera, a wearable device, or a home appliance. The electronic device 1 according to the embodiment of this document is not limited to the devices described above.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A light emitting display device comprising:

a pixel driving part including a transistor;

a planarization layer covering the pixel driving part;

an anode of a light emitting diode disposed on the planarization layer;

a pixel defining layer including an opening that overlaps the anode of the light emitting diode in a plan view, and including an inorganic insulating material;

a wall including an opening overlapping the opening of the pixel defining layer and having conductivity;

a light emitting layer disposed in the opening of the pixel defining layer;

a cathode of the light emitting diode disposed on the light emitting layer; and a separator dividing the wall into a first wall and a second wall, wherein the first wall is electrically connected to the transistor of the pixel driving part through a first contact hole passing through the pixel defining layer and the planarization layer, and the cathode of the light emitting diode is in contact with a side of the first wall and is electrically connected to the transistor.

2. The light emitting display device of claim 1, wherein the first wall includes a first conductive wall and a second conductive wall disposed on the first conductive wall, and the second conductive wall has a tip portion that protrudes from the first conductive wall.

3. The light emitting display device of claim 2, wherein the tip portion protrudes toward the opening of the first wall overlapping the opening of the pixel defining layer.

4. The light emitting display device of claim 3, wherein the first conductive wall includes aluminum, and the second conductive wall includes titanium.

5. The light emitting display device of claim 3, wherein the first wall is an inner conductive wall, the second wall is an outer conductive wall, the inner conductive wall surrounds the opening of the pixel defining layer in a plan view, the outer conductive wall is electrically separated from the inner conductive wall, the inner conductive wall includes a first inner conductive wall and a second inner conductive wall disposed on the first inner conductive wall, and the outer conductive wall includes a first outer conductive wall and a second outer conductive wall disposed on the first outer conductive wall.

6. The light emitting display device of claim 5, wherein the inner conductive wall is electrically connected to the transistor of the pixel driving part through the first contact hole, and the outer conductive wall receives a constant voltage through a second contact hole passing through the pixel defining layer and the planarization layer.

7. The light emitting display device of claim 6, wherein a separated light emitting layer and a separated cathode are formed on the outer conductive wall, respectively, and are separated from the light emitting layer and the cathode by the separator.

8. The light emitting display device of claim 1, further comprising:

an encapsulation layer covering the wall and the cathode, wherein the separator includes an empty space passing through the encapsulation layer and the wall.

9. The light emitting display device of claim 8, wherein the empty space of the separator is filled with an insulating material.

10. The light emitting display device of claim 9, further comprising:

a transparent electrode formed of a transparent conductive material and disposed on the encapsulation layer and the separator, and a constant voltage is applied to the transparent electrode.

11. The light emitting display device of claim 1, further comprising:

an encapsulation layer covering the wall and the cathode, the separator passes through the wall and is disposed between the first wall and the second wall, and the encapsulation layer is disposed on the separator.

12. A light emitting display device comprising:

a pixel driving part including a transistor;

a planarization layer covering the pixel driving part;

an anode of a light emitting diode disposed on the planarization layer;

a pixel defining layer including an opening that overlaps the anode of the light emitting diode in a plan view, the pixel defining layer including a black pixel defining layer and a transparent pixel defining layer;

a wall including an opening overlapping the opening of the pixel defining layer and having conductivity;

a light emitting layer disposed in the opening of the pixel defining layer;

a cathode of the light emitting diode disposed on the light emitting layer; and a separator dividing the wall into a first wall and a second wall, wherein, the first wall is electrically connected to the transistor of the pixel driving part through a first contact hole passing through the pixel defining layer and the planarization layer, the cathode of the light emitting diode is in contact with a side of the first wall and is electrically connected to the transistor, the black pixel defining layer is formed of a black organic material or an organic material including a light blocking material, and the transparent pixel defining layer is formed of a photosensitive organic insulating material that transmits light.

13. The light emitting display device of claim 12, wherein the pixel defining layer further includes an intermediate pixel defining layer, and the intermediate pixel defining layer is an inorganic insulating layer, and disposed between the black pixel defining layer and the transparent pixel defining layer.

14. The light emitting display device of claim 12, wherein the first wall includes a first conductive wall and a second conductive wall disposed on the first conductive wall, the second conductive wall has a tip portion protruding from the first conductive wall, and the tip portion protrudes toward the opening of the first wall overlapping the opening of the pixel defining layer.

15. The light emitting display device of claim 14, wherein the first conductive wall includes aluminum, and the second conductive wall includes titanium.

16. The light emitting display device of claim 14, wherein the first wall is an inner conductive wall, the second wall is an outer conductive wall, the inner conductive wall surrounds the opening of the pixel defining layer in a plan view, the outer conductive wall is electrically separated from the inner conductive wall, the inner conductive wall includes a first inner conductive wall and a second inner conductive wall disposed on the first inner conductive wall, the outer conductive wall includes a first outer conductive wall and a second outer conductive wall disposed on the first outer conductive wall, the inner conductive wall is electrically connected to the transistor of the pixel driving part through the first contact hole, and the outer conductive wall receives a constant voltage through a second contact hole passing through the pixel defining layer and the planarization layer.

17. The light emitting display device of claim 16, wherein a separated light emitting layer and a separated cathode are formed on the outer conductive wall, respectively, and are separated from the light emitting layer and the cathode by the separator.

18. The light emitting display device of claim 12, further comprising:

an encapsulation layer covering the wall and the cathode, wherein the separator includes an empty space passing through the encapsulation layer and the wall.

19. The light emitting display device of claim 18, wherein the empty space of the separator is filled with an insulating material.

20. The light emitting display device of claim 12, further comprising:

an encapsulation layer covering the wall and the cathode, the separator passes through the wall and is disposed between the first wall and the second wall, and the encapsulation layer is disposed on the separator.

* * * * *